(12) United States Patent
Yang et al.

(10) Patent No.: US 11,315,875 B2
(45) Date of Patent: Apr. 26, 2022

(54) SEMICONDUCTOR DEVICES AND METHODS OF MANUFACTURING SEMICONDUCTOR DEVICES

(71) Applicant: Amkor Technology Singapore Holding Pte. Ltd., Valley Point #12/203 (SG)

(72) Inventors: Ki Yeul Yang, Incheon (KR); Kyung Han Ryu, Incheon (KR); Hyun Cho, Incheon (KR)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 0 days.

(21) Appl. No.: 16/665,550

(22) Filed: Oct. 28, 2019

(65) Prior Publication Data

US 2021/0125934 A1    Apr. 29, 2021

(51) Int. Cl.
*H01L 23/532* (2006.01)
*H01L 23/498* (2006.01)
*H01L 23/538* (2006.01)

(52) U.S. Cl.
CPC .. *H01L 23/53238* (2013.01); *H01L 23/49816* (2013.01); *H01L 23/5385* (2013.01); *H01L 23/5386* (2013.01)

(58) Field of Classification Search
CPC ......... H01L 23/53238; H01L 23/49816; H01L 23/5386; H01L 23/5385; H01L 21/76841–76876; H01L 23/53223; H01L 23/53252; H01L 23/53266; H01L 2221/1073–1089; H01L 21/02362; H01L 2224/16245–1626; H01L 2224/24225–24227; H01L 23/28–3192
See application file for complete search history.

(56) References Cited

U.S. PATENT DOCUMENTS

| | | | |
|---|---|---|---|
| 2004/0131878 A1* | 7/2004 | Seet | H01L 21/76843 428/641 |
| 2015/0017764 A1* | 1/2015 | Lin | H01L 25/03 438/107 |
| 2019/0115311 A1* | 4/2019 | Yu | H01L 24/02 |
| 2020/0075496 A1* | 3/2020 | Yu | H01L 24/32 |

\* cited by examiner

*Primary Examiner* — Shahed Ahmed
(74) *Attorney, Agent, or Firm* — McAndrews, Held & Malloy, Ltd.

(57) ABSTRACT

Various aspects of the present disclosure provide a device that comprises an electronic device comprising a first device side, a second device side, and a first lateral device side. The example device may, for example, also comprise a substrate comprising a first substrate side, a second substrate side, and a first lateral substrate side. The substrate may, for example, comprise a first conductive pattern, a first barrier structure, and a second conductive pattern. The first conductive pattern may, for example, comprise a first side, a second side, and a first lateral side. The first barrier structure may, for example, be on the first lateral side of the first conductive pattern. The second conductive pattern may, for example, comprise a first side, a second side, and a first lateral side. The first lateral side of the second conductive pattern may, for example, be free of a metal barrier structure.

20 Claims, 23 Drawing Sheets

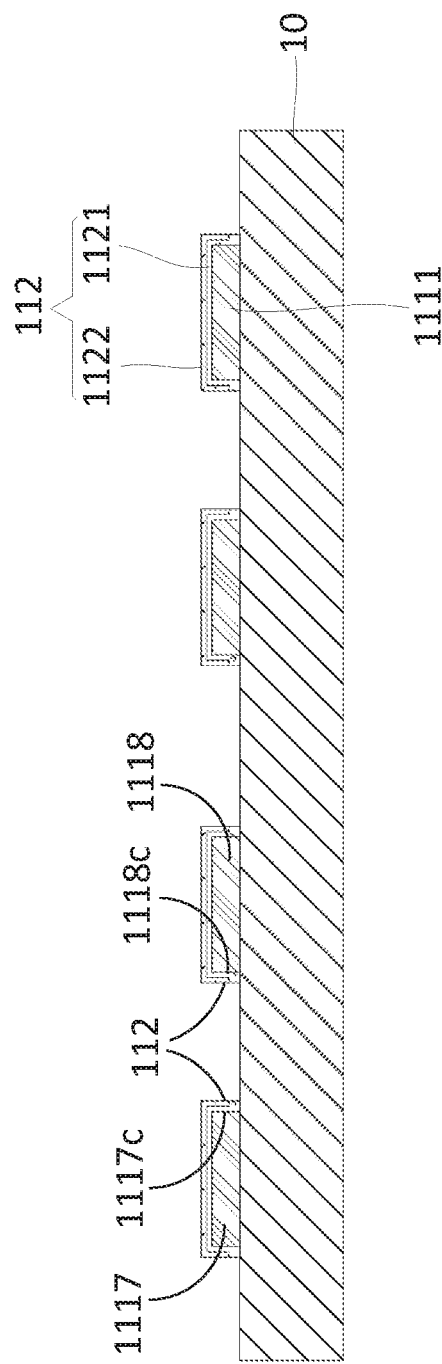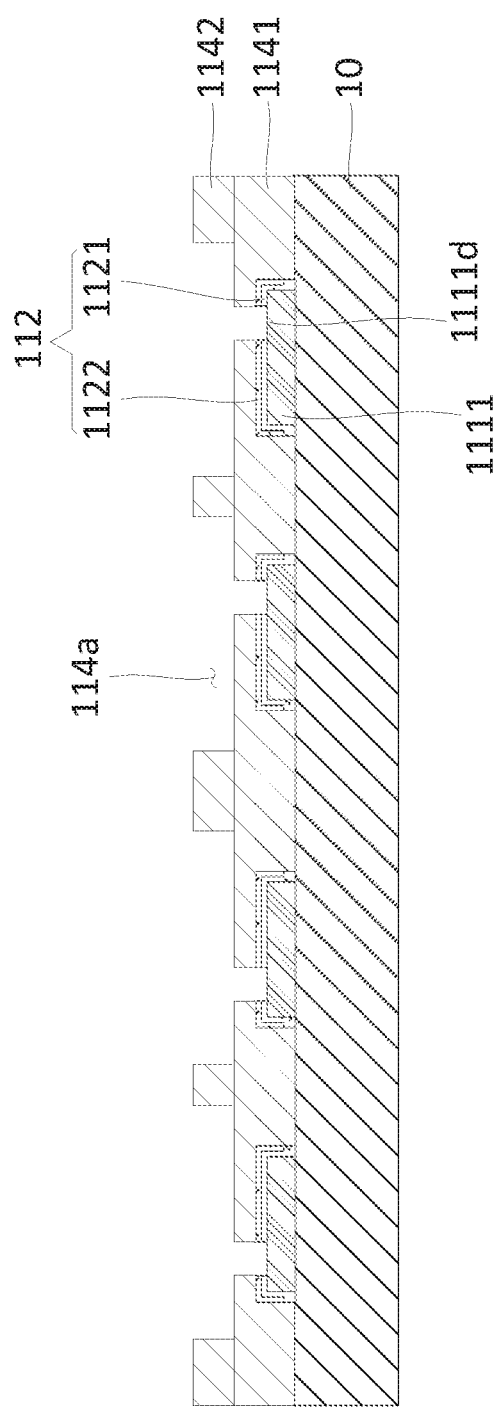

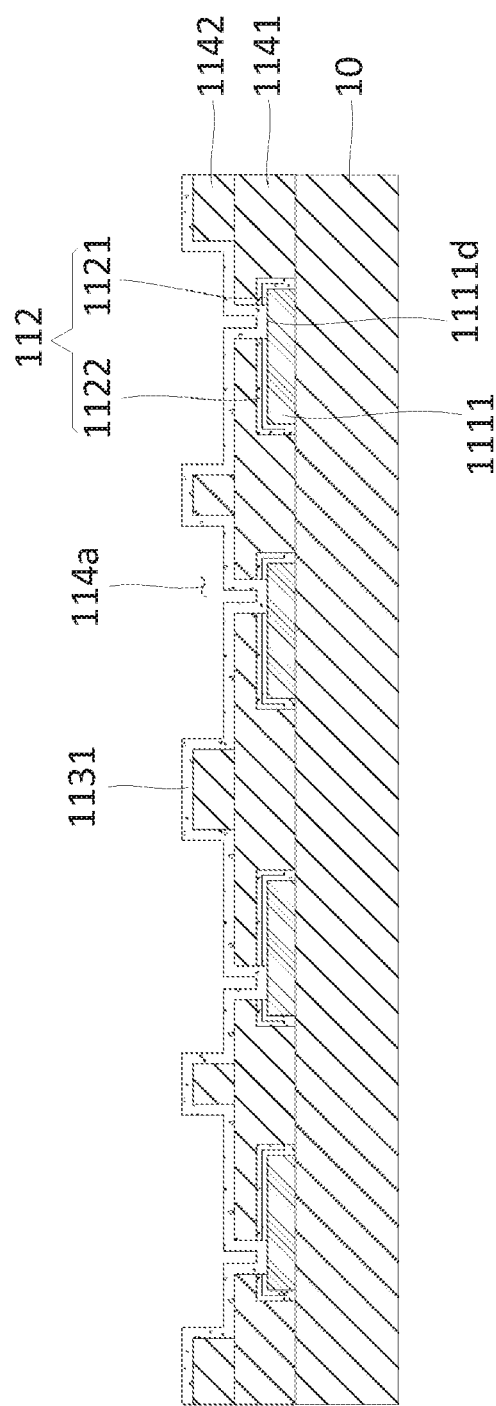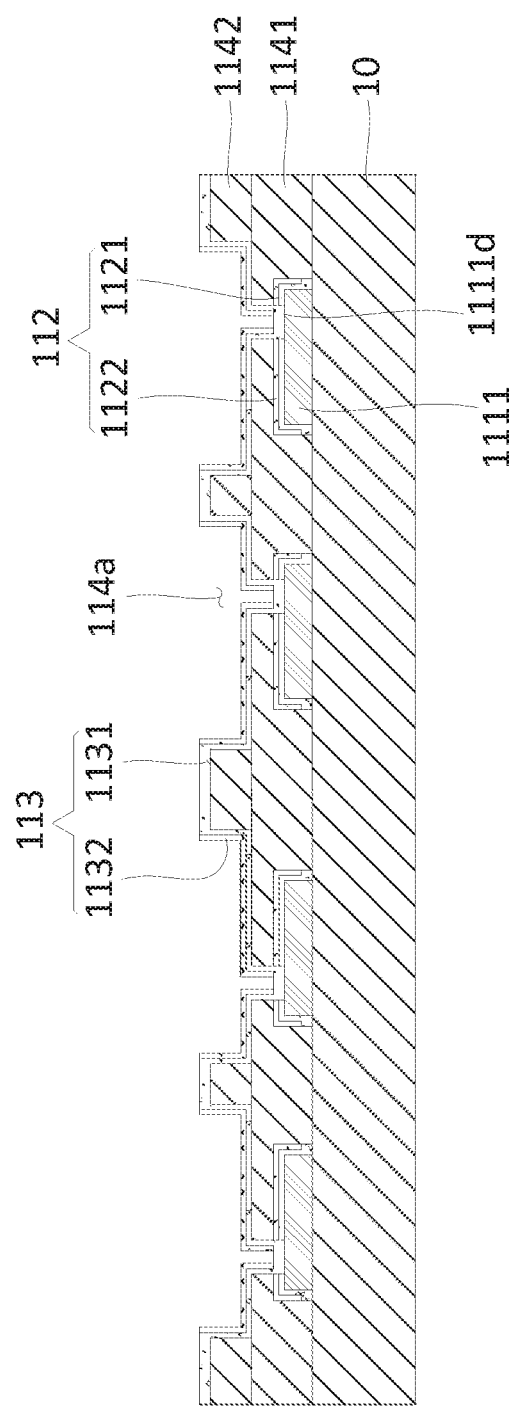

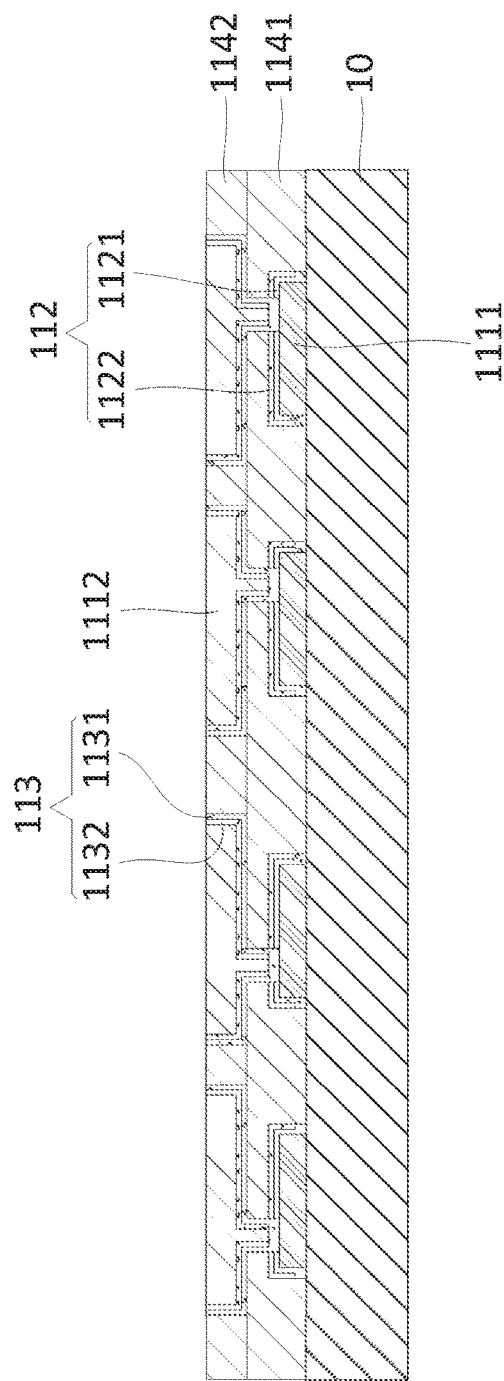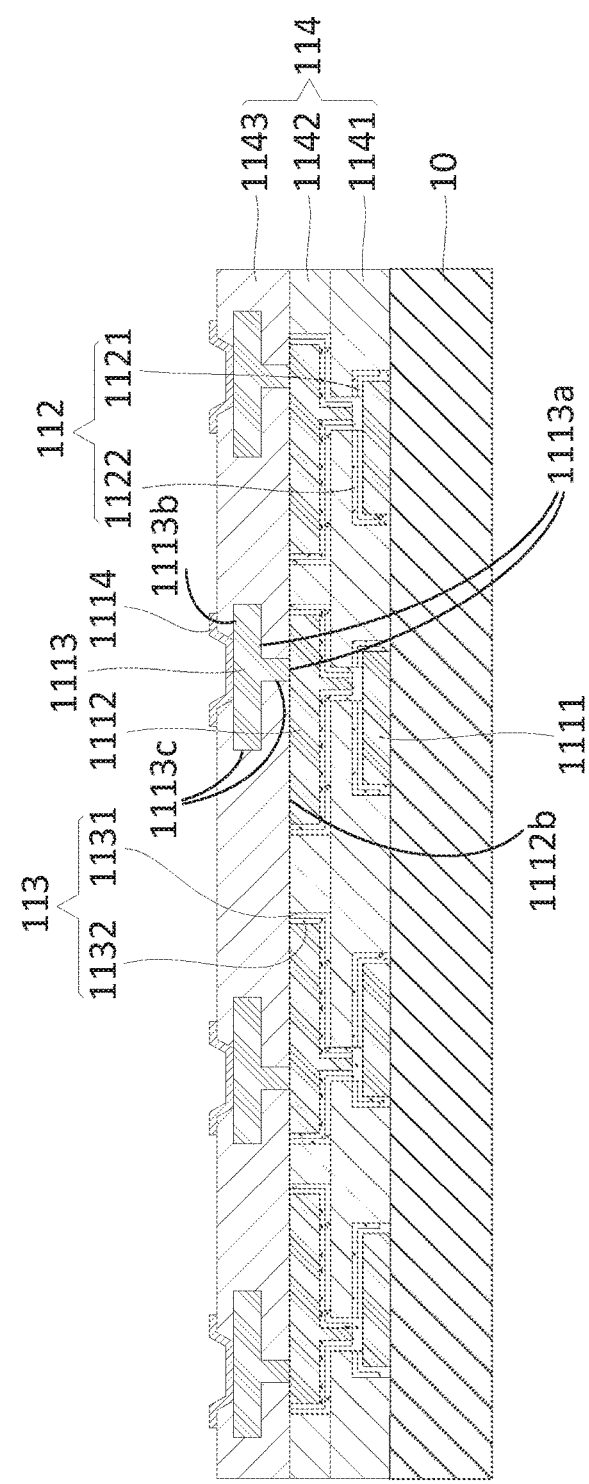

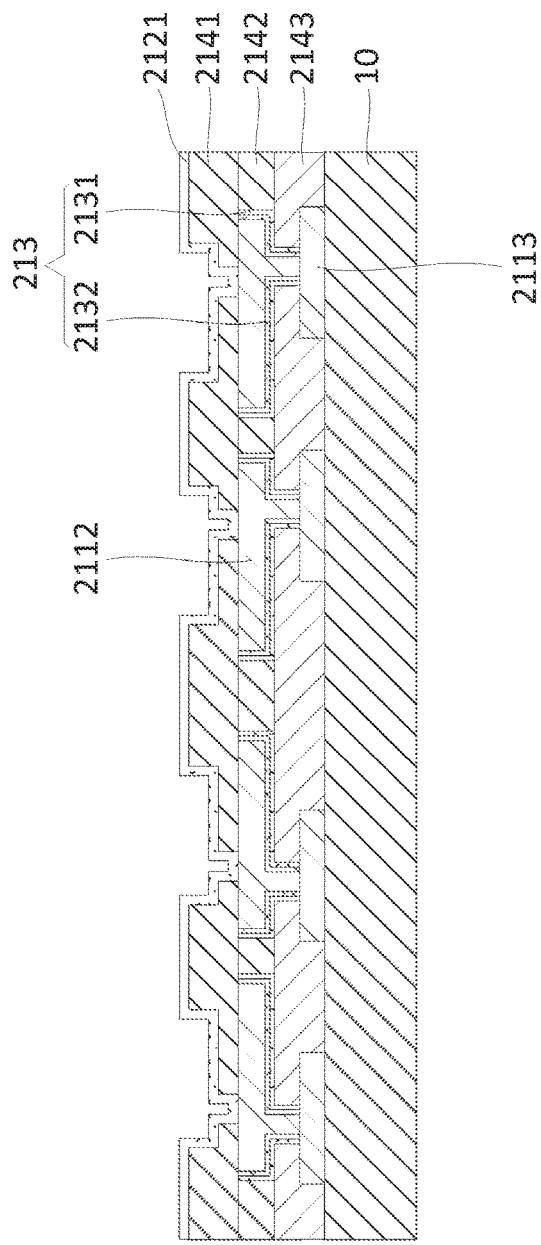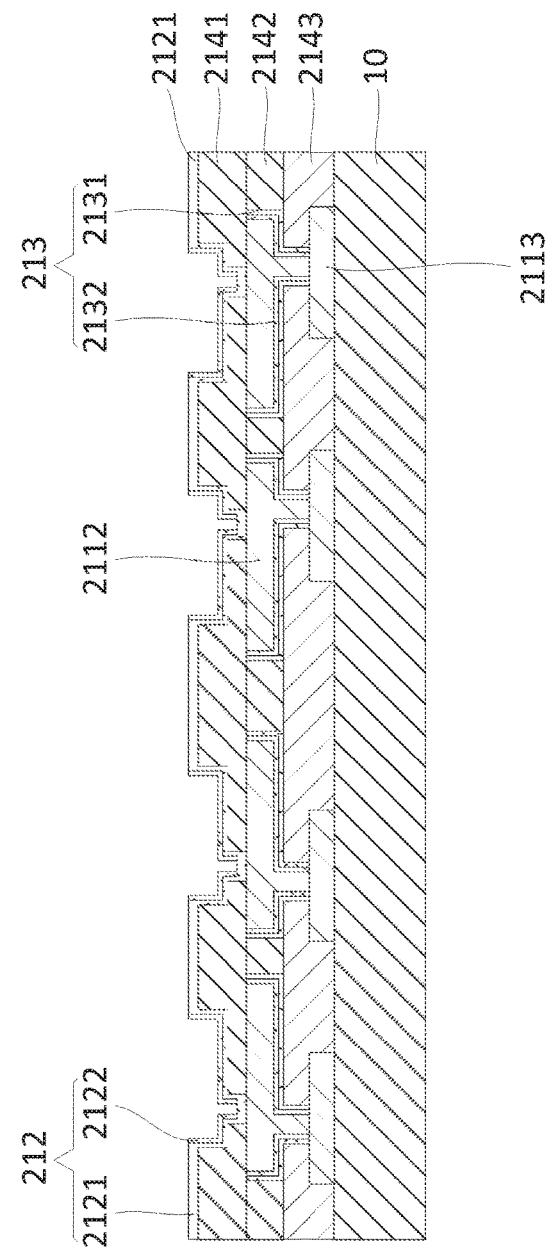

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

DESCRIPTION

Figure 1:
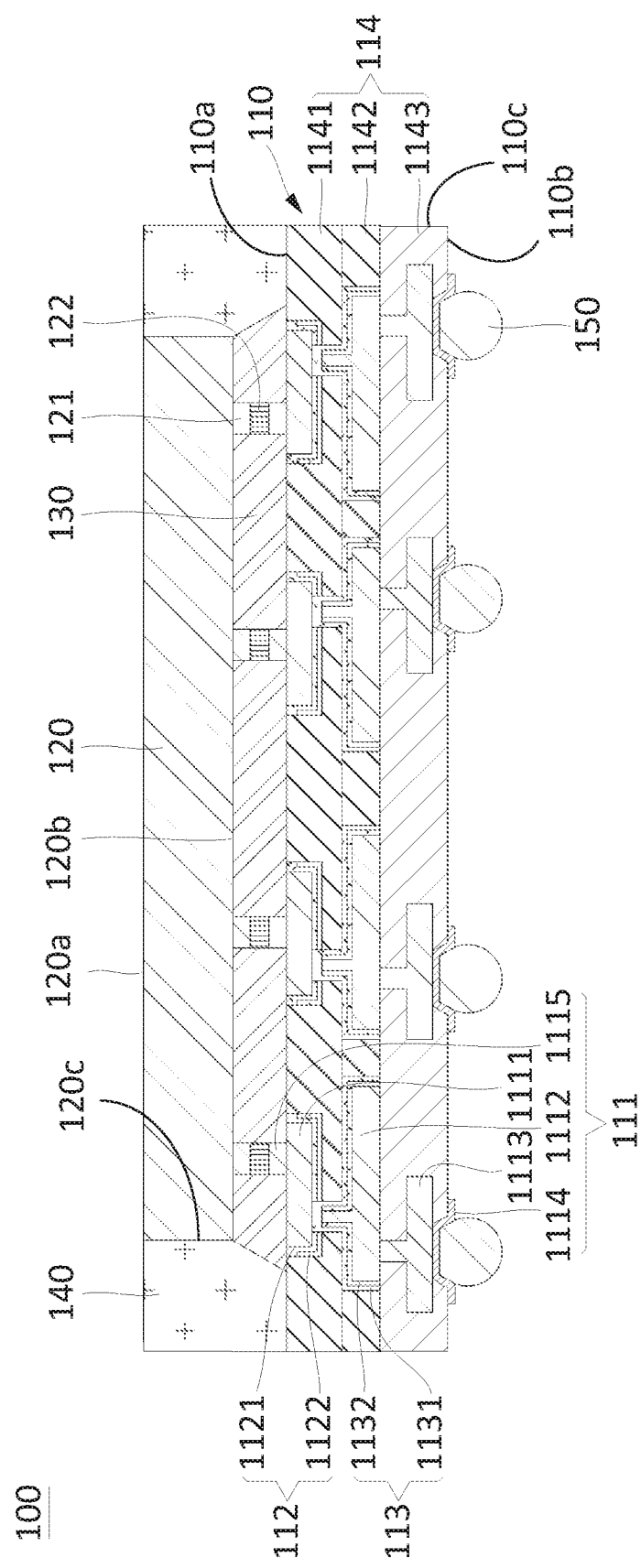
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

In a first example implementation, various aspects of the present disclosure provide a device (e.g., an electronic device, etc.) that comprises an electronic device (e.g., a semiconductor device, a passive device, etc.) comprising a first device side, a second device side opposite the first device side, and a first lateral device side that extends between the first device side and the second device side. The example device may, for example, also comprise a substrate comprising a first substrate side facing toward the second device side, a second substrate side opposite the first substrate side, and a first lateral substrate side that extends between the first substrate side and the second substrate side. The substrate may, for example, comprise a first conductive pattern (CP1), a first barrier structure, and a second conductive pattern (CP2). The first conductive pattern (CP1) may, for example, comprise a first CP1 side facing toward the electronic device, a second CP1 side opposite the first CP1 side, and a first lateral CP1 side that extends between the first CP1 side and the second CP1 side. The first barrier structure may, for example, be on the first lateral CP1 side, and the first barrier structure may comprise metal. The second conductive pattern (CP2) may, for example, comprise a first CP2 side facing toward the second CP1 side, a second CP2 side opposite the first CP2 side, and a first lateral CP2 side that extends between the first CP2 side and the second CP2 side. The first CP2 lateral side may, for example, be free of a metal barrier structure.

In a second example implementation, various aspects of the present disclosure provide a device (e.g., an electronic device, etc.) that comprises an electronic device (e.g., a semiconductor device, a passive device, etc.) comprising a first device side, a second device side opposite the first device side, and a first lateral device side that extends between the first device side and the second device side. The example device may, for example, also comprise a substrate comprising a first substrate side facing toward the second device side, a second substrate side opposite the first substrate side, and a first lateral device side that extends between the first substrate side and the second substrate side. The substrate may, for example, comprise a first metal trace (MT1), a second metal trace (MT2), and a first barrier structure. The first metal trace (MT1) may, for example, comprise a first MT1 side facing toward the electronic device, a second MT1 side opposite the first MT1 side, and a first lateral MT1 side that extends between the first MT1 side and the second MT1 side. The second metal trace (MT2) may, for example, comprise a first MT2 side facing toward the electronic device, a second MT2 side opposite the first MT2 side, and a first lateral MT2 side that extends between the first MT2 side and the second MT2 side. The first barrier structure may, for example, be on the first lateral MT1 side and positioned laterally between the first lateral MT1 side and the first lateral MT2 side, and the first barrier structure may, for example, comprise metal.

A third example implementation may, for example, comprise a method of making a device (e.g., an electronic device, etc.). The method may, for example, comprise providing an electronic device comprising a first device side, a second device side opposite the first device side, and a first lateral device side that extends between the first device side and the second device side. The method may also, for example, comprise providing a substrate comprising a first substrate side facing toward the second device side, a second substrate side opposite the first substrate side, and a first lateral device side that extends between the first substrate side and the second substrate side. The substrate may, for example, comprise a first conductive pattern (CP1), a first barrier structure, and a second conductive pattern (CP1). The first conductive pattern (CP1) may, for example, comprise a first CP1 side facing toward the electronic device, a second CP1 side opposite the first CP1 side, and a first lateral CP1 side that extends between the first CP1 side and the second CP1 side. The first barrier structure may, for example, be on the first lateral CP1 side, and the first barrier structure may comprise metal. The second conductive pattern (CP2) may, for example, comprise a first CP2 side facing toward the second CP1 side, a second CP2 side opposite the first CP2 side, and a first lateral CP2 side that extends between the first CP2 side and the second CP2 side. The first CP2 lateral side may, for example, be free of a metal barrier structure.

Other examples are included in the present disclosure. Such examples may be found in the figures, in the claims, in the Abstract and/or in the description of the present disclosure.

FIG. 1 shows a cross-sectional view of an example semiconductor device. In the example shown in FIG. 1, semiconductor device 100 can comprise substrate 110, electronic device 120, underfill 130, encapsulant 140 and external interconnect 150.

Substrate 110 can comprise conductive structure 111, first barrier structure 112, second barrier structure 113 and dielectric structure 114. Conductive structure 111 can comprise conductive patterns 1111, 1112 and 1113, base interconnect 1114 and top interconnect 1115. First barrier structure 112 can comprise first barrier seed 1121 and first barrier 1122. Second barrier structure 113 can comprise second barrier seed 1131 and second barrier 1132. Dielectric structure 114 can comprise dielectrics 1141, 1142, and 1143. Electronic device 120 can comprise device terminal 121 and device interconnect 122. The electronic device 120 may, for example, comprise a first device side 120a, a second device side 120b, and a first lateral device side 120c (e.g., one of a plurality thereof) that extends between the first device side 120a and the second device side 120b. The substrate 110 may, for example, comprise a first substrate side 110a, a second substrate side 110b, and a lateral substrate side 110c (e.g., one of a plurality thereof) that extends between the first substrate side 110a and the second substrate side 110b.

Figure 2A:
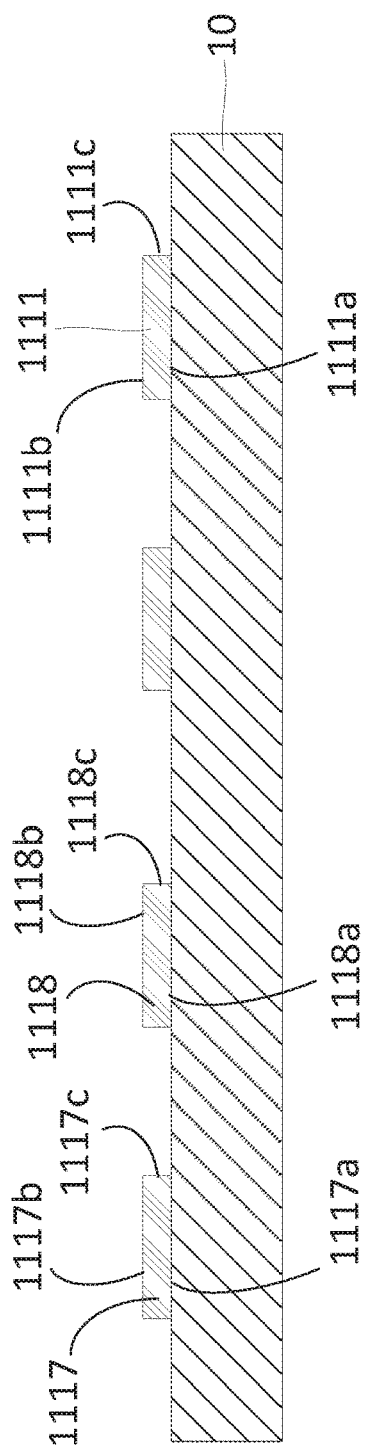
FIGS. 2A to 2R show cross-sectional views of an example method for manufacturing an example semiconductor device.

In an example implementation and referring to FIGS. 1 and 2A, the first conductive pattern 1111 may comprise a first side 1111a facing toward the electronic device 120, a second side 1111b opposite the first side 1111a, and a first lateral side 1111c (e.g., one of a plurality thereof) that extends between the first side 1111a and the second side 1111b. Also, in the example implementation and referring to FIGS. 1, 2J, and 2K, the second conductive pattern 1112 may comprise a first side 1112a facing toward the second side 1111b of the first conductive pattern 1111, a second side 1112b opposite the first side 1112a, and a first lateral side 1112c (e.g., one of a plurality thereof) that extends between the first side 1112a and the second side 1112b. Additionally, in the example implementation and referring to FIGS. 1 and 2N, the third conductive pattern 1113 may comprise a first side 1113a facing toward the second side 1112b of the second conductive pattern 1112, a second side 1113b opposite the first side 1113a, and a first lateral side 1113c (e.g., one of a plurality thereof) that extends between the first side 1113a and the second side 1113b.

In an example implementation, the first barrier structure 112 may inhibit (e.g., substantially reduce, eliminate, etc.) lateral migration of metal between laterally adjacent segments of the first conductive pattern 1111. The first barrier structure 112 may also inhibit vertical migration of metal between segments of the first conductive pattern 1111 and other conductive patterns (e.g., second conductive pattern 1112, third conductive pattern 1113, etc.). Similarly, the second barrier structure 113 may inhibit (e.g., substantially reduce, eliminate, etc.) lateral migration of metal between laterally adjacent segments of the second conductive pattern 1112. The second barrier structure 113 may also inhibit vertical migration of metal between segments of the second conductive pattern 1112 and other conductive patterns (e.g., first conductive pattern 1111, second conductive pattern 1113, etc.).

In an example configuration, the first side 1111a of the first conductive pattern 1111 may be free of the first barrier structure 112, and the first barrier structure 112 may cover a majority (e.g., most or all) of the second side 1111b of the first conductive pattern 1111. The first barrier structure 112 may also, for example, laterally surround most or all of the first conductive pattern 1111.

In an example configuration, the second side 1112b of the second conductive pattern 1112 may be free of the second barrier structure 113, and the second barrier structure 113 may cover a majority (e.g., most or all) of the first side 1112a of the second conductive pattern 1112. The second conductive pattern 1112 may, for example, comprises a trace 1112d and a via 1112e. In an example implementation, the second barrier structure 113 may laterally surround most or all of the trace 1112d and the via 1112e.

Substrate 110, underfill 130, encapsulant 140 and external interconnect 150 can be referred to as a semiconductor package or a package, and can provide protection for electronic device 120 from external elements and/or environmental exposure. In addition, semiconductor package can provide electrical coupling between an external component and electronic device 120.

Figure 2B:
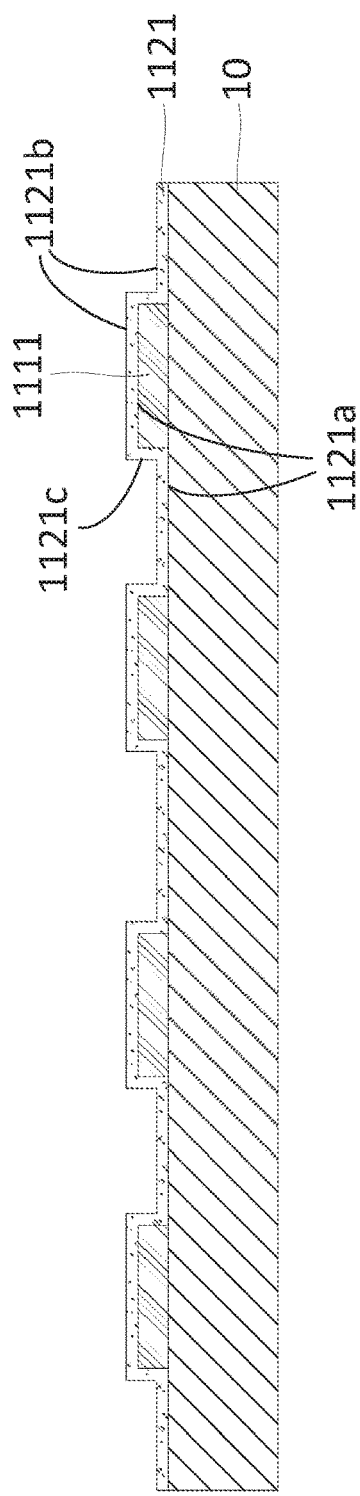
Figure 2C:
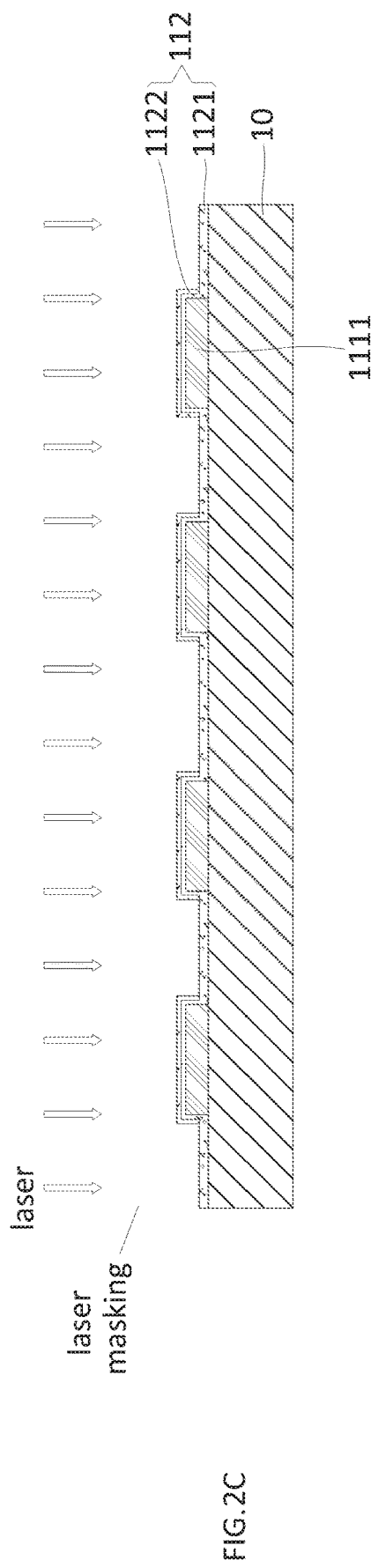
Figure 2D:
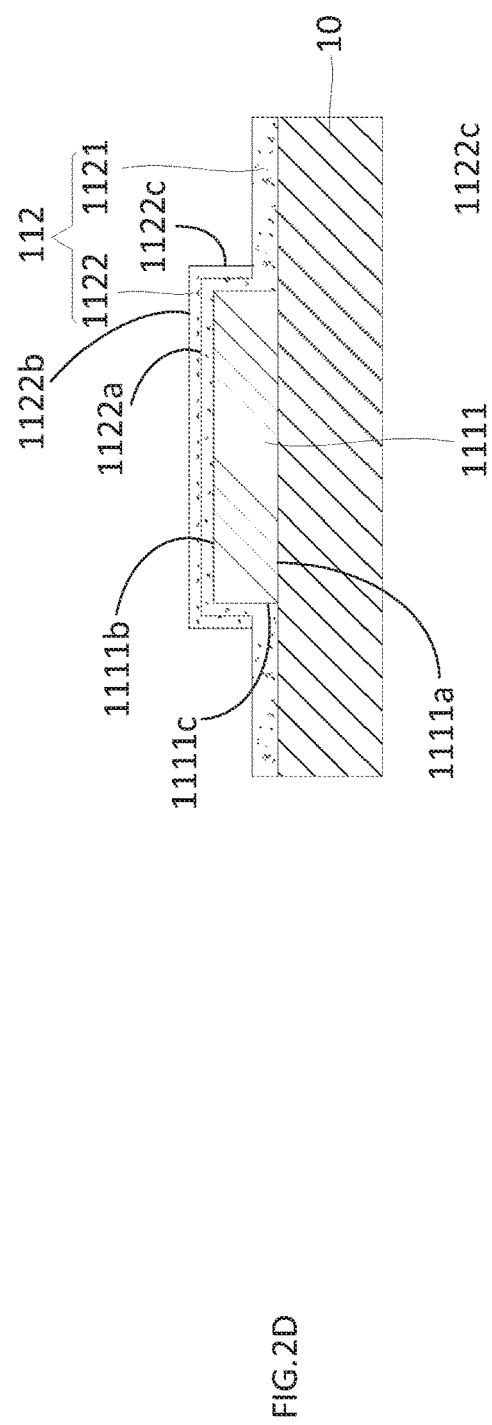
Figure 2I:
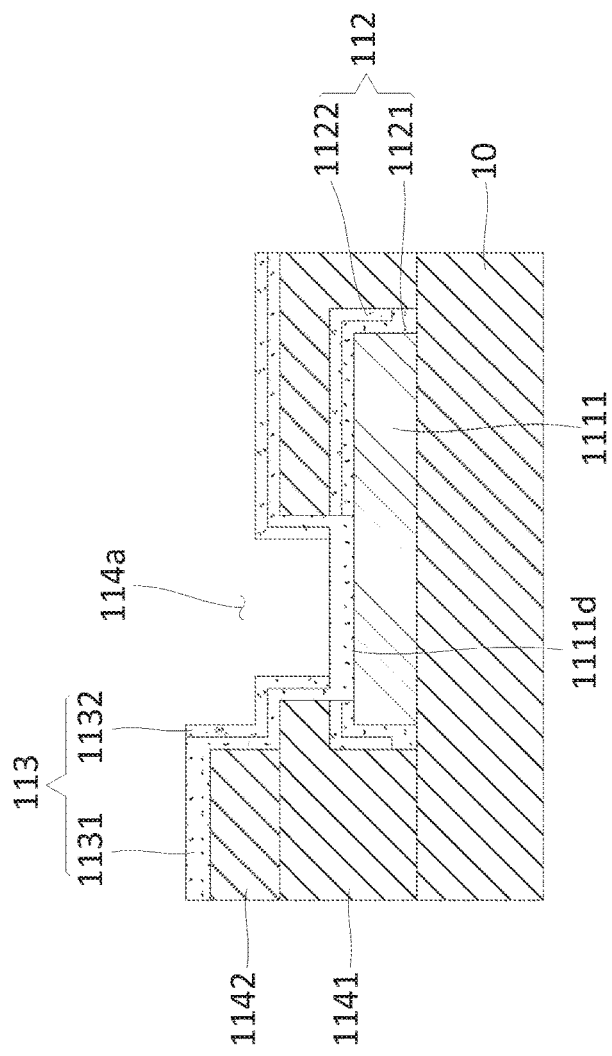
Figure 2J:
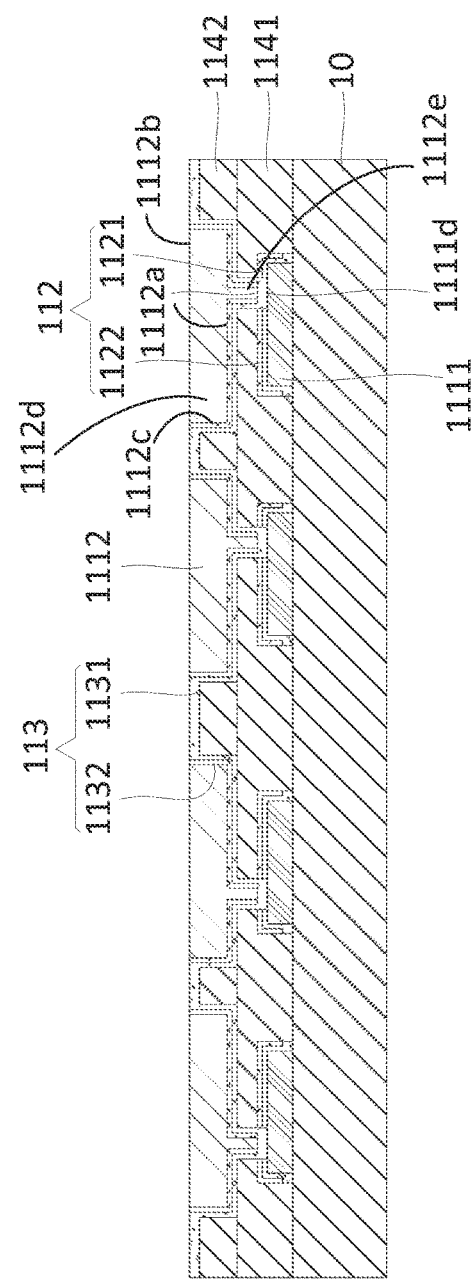
Figures 2K, 2L:
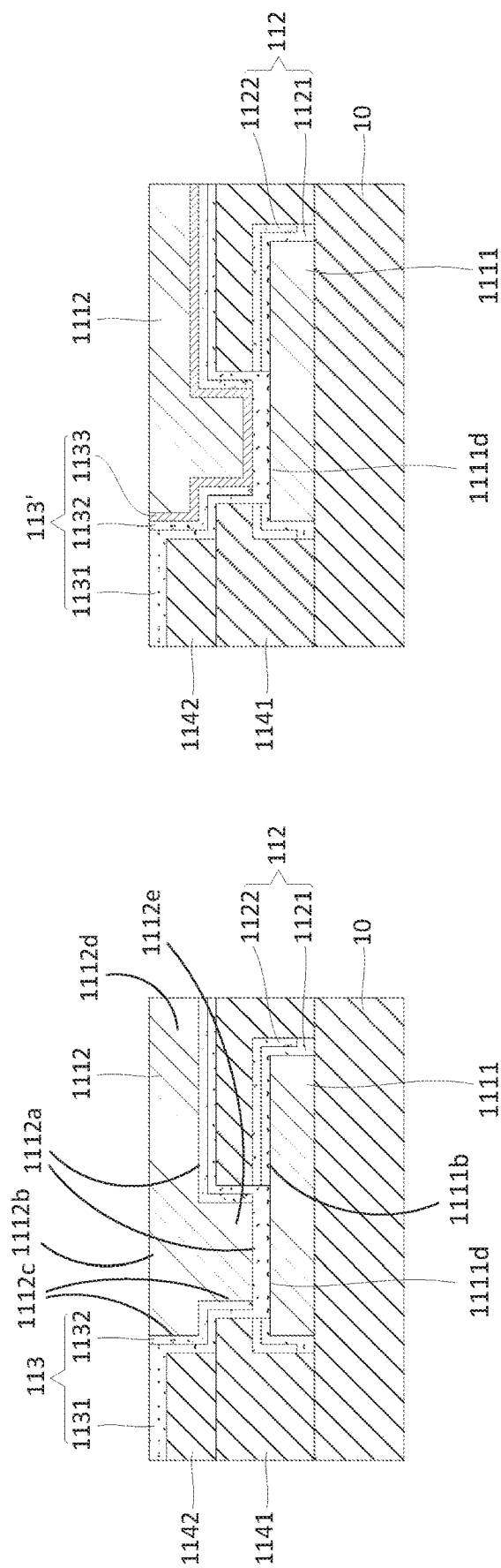
Figure 2O:
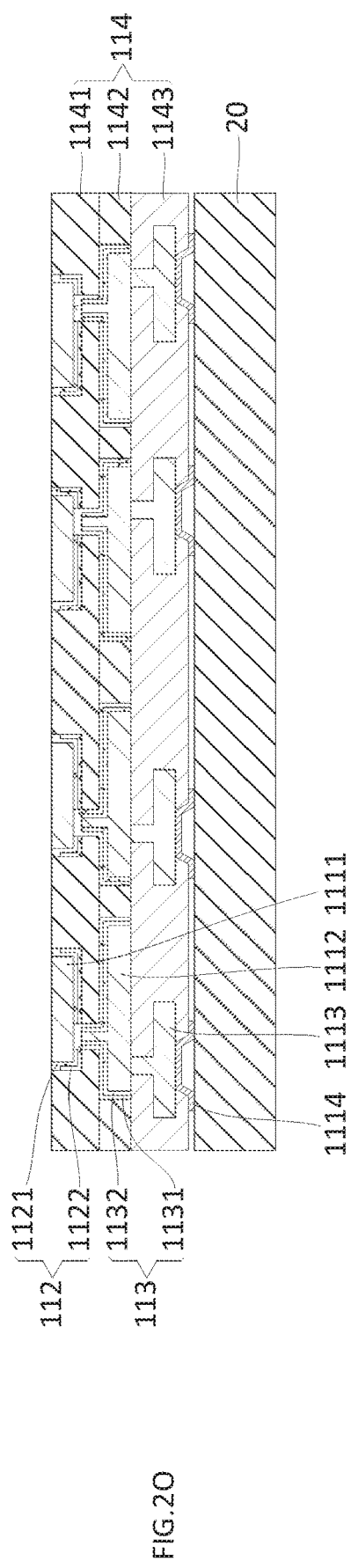
Figure 2P:
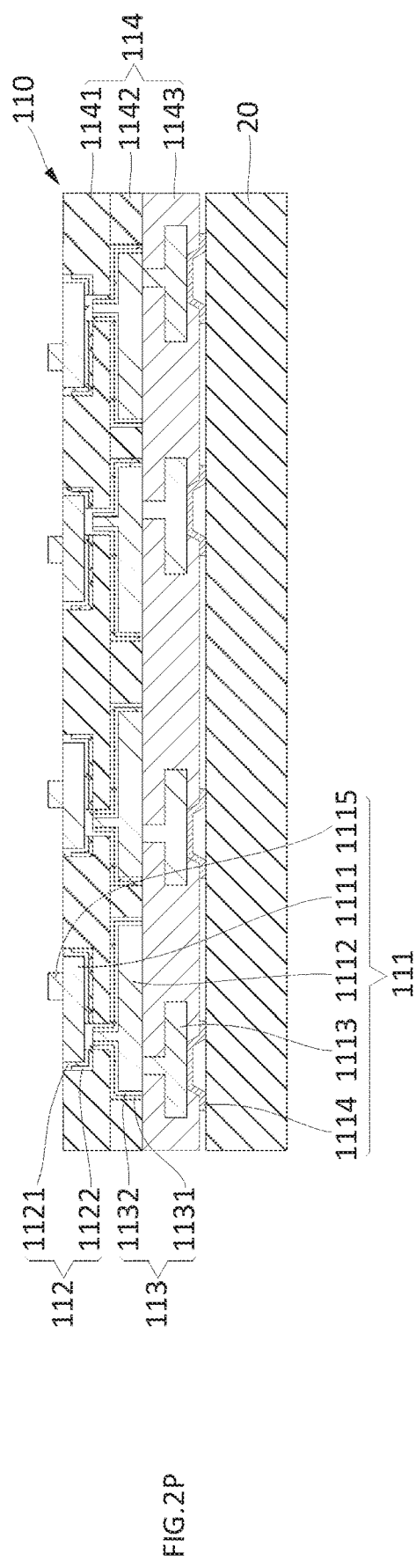
Figure 2Q:
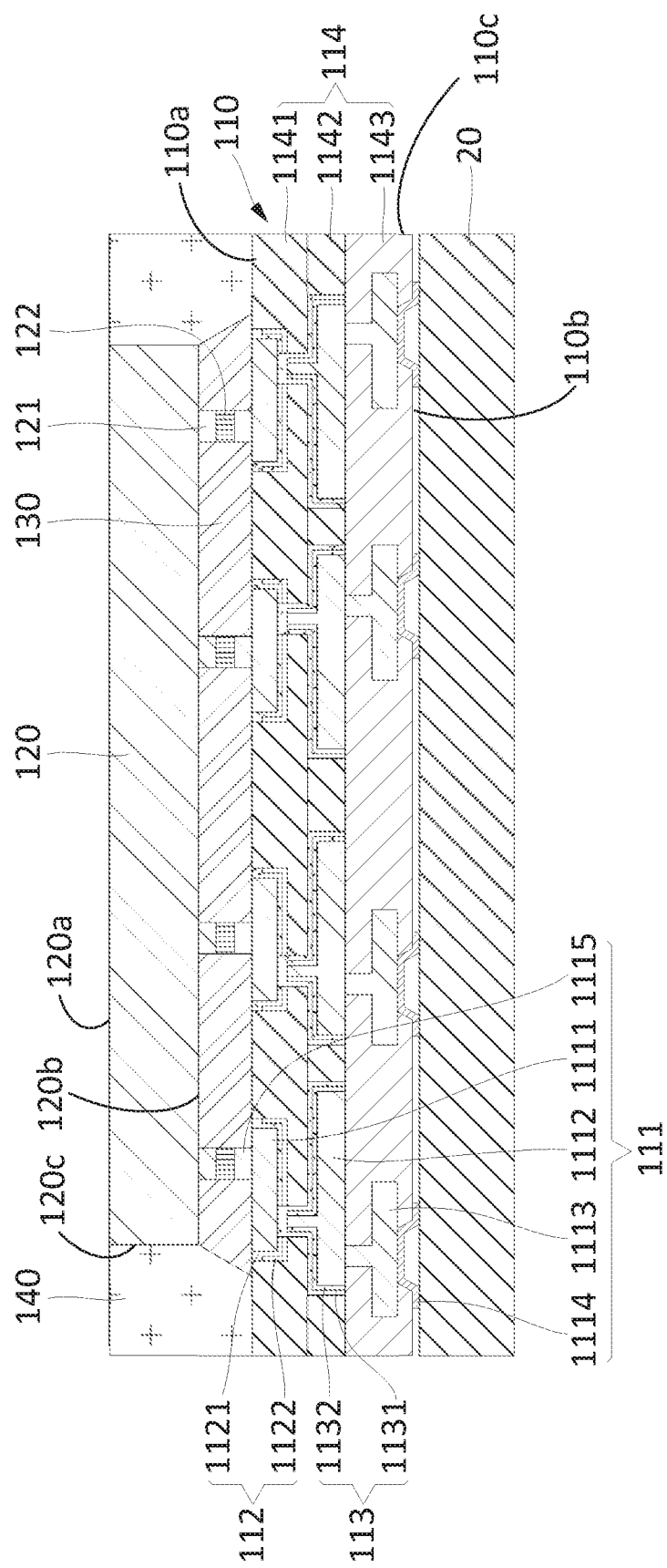
Figure 2R:
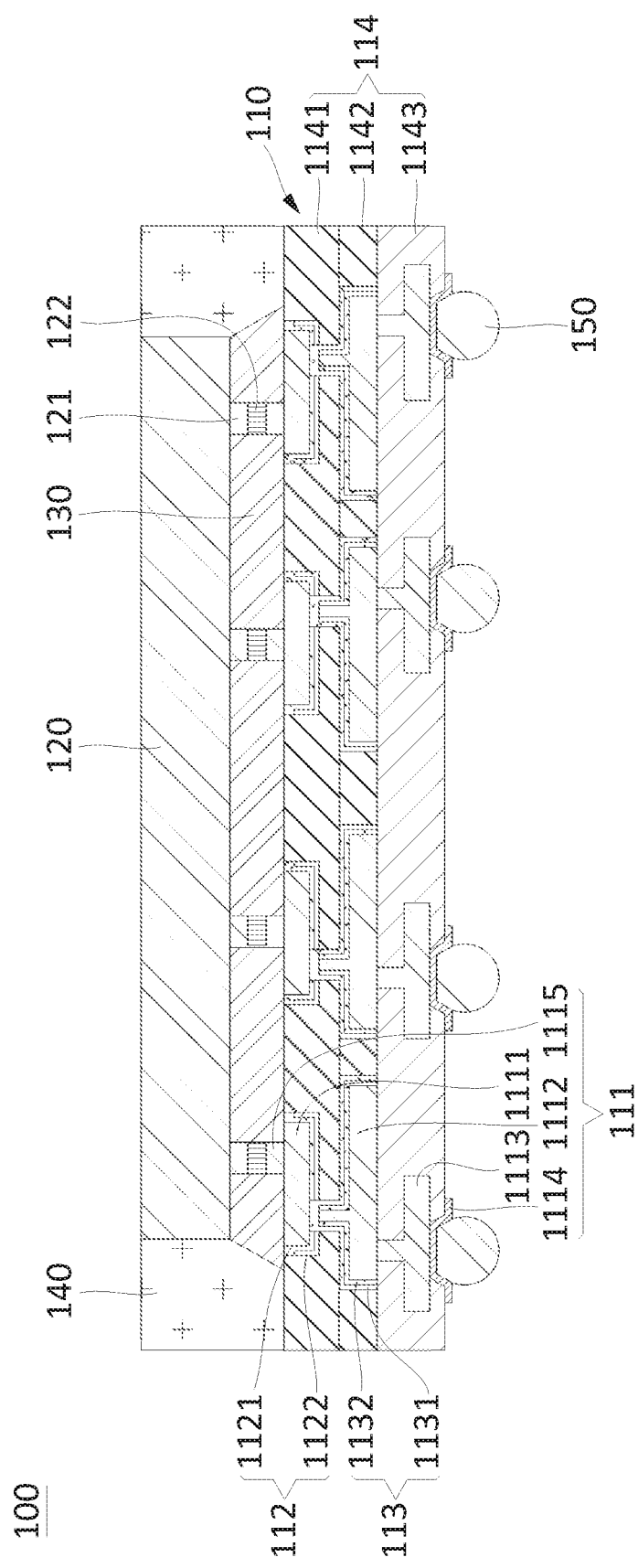

FIGS. 2A to 2R show cross-sectional views of an example method for manufacturing an example semiconductor device. FIG. 2A shows a cross-sectional view of semiconductor device 100 at an early stage of manufacture.

In the example shown in FIG. 2A, conductive pattern 1111, which may also for example and without limitation be referred to herein as "first conductive pattern 1111," can be formed on a top surface of carrier 10. In some examples, carrier 10 can comprise silicon, glass, a metal, an adhesive film or an adhesive tape. In some examples, conductive pattern 1111 can comprise or be referred to as one or more traces, vias, conductors, conductive materials, conductive paths, conductive layers, redistribution layers (RDL), wiring patterns, trace patterns, or circuit patterns. In an example implementation (e.g., referring to FIG. 2A and FIG. 1), the conductive pattern 1111 may comprise a first side 1111a facing toward the electronic device 120, a second side 1111b opposite the first side 1111a, and a first lateral side 1111c (e.g., one of a plurality thereof) that extends between the first side 1111a and the second side 1111b. Conductive pattern 1111 can comprise, for example, an electrically conductive material, such as copper (Cu), aluminum (Al), palladium (Pd), titanium (Ti), tungsten (W), Ti/W, nickel (Ni), gold (Au), or silver (Ag). Conductive pattern 1111 can be formed using, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, conductive pattern 1111 can have a thickness in the range from approximately 2 μm (micrometer) to approximately 5 μm. Conductive pattern 1111 can be exposed to one surface of substrate 110 to then be electrically connected to electronic device 120. Conductive pattern 1111 can transfer or redistribute signals, currents or voltages in substrate 110. In the example implementation shown in FIG. 2A, the conductive pattern 1111 may comprise a first metal trace 1117 comprising a first side 1117a, a second side 1117b opposite the first side 1117a, and a lateral side 1117c that extends between the first side 1117a and the second side 1117b. In such example implementation, the conductive pattern 1111 may also comprise a second metal trace 1118 comprising a first side 1118a, a second side 1118b opposite the first side 1118a, and a lateral side 1118c that extends between the first side 1118a and the second side 1118b.

FIG. 2B shows a cross-sectional view of semiconductor device 100 at a later stage of manufacture. In the example shown in FIG. 2B, first barrier seed 1121 can be entirely formed on a top surface of carrier 10. First barrier seed 1121 can be formed to cover conductive pattern 1111 formed on the top surface of carrier 10. In some examples, first barrier seed 1121 can comprise or be referred to as a conductive layer, a seed layer or a seed metal. The first barrier seed 1121 may, for example, comprise a first side 1121a, a second side 1121b opposite the first side 1121a, and a lateral side 1121c (e.g., one of a plurality thereof) that extends between the first side 1121a and the second side 1121b. First barrier seed 1121 can comprise titanium (Ti), for example, but this is not a limitation of the present disclosure and other materials may be used (e.g., titanium tungsten (TiW), etc.). In some examples, first barrier seed 1121 can comprise an electrically conductive material, such as nickel (Ni), cobalt (Co), molybdenum (Mo), manganese (Mn), gold (Au), silver (Ag), tantalum (Ta), tantalum nitride (TaN), etc. First barrier seed 1121 can be formed using, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In addition, first barrier seed 1121 can be a seed for forming first barrier 1122. First barrier seed 1121 can have a thickness in the range from approximately 2 μm to approximately 5 μm.

FIG. 2C shows a cross-sectional view of semiconductor device 100 at a later stage of manufacture, and FIG. 2D shows an enlarged cross-sectional view of a portion of FIG. 2C. In the example shown in FIGS. 2C and 2D, first barrier 1122 can be formed on a region of first barrier seed 1121. In some examples, laser masking can be formed on first barrier seed 1121, and UV (Ultraviolet) laser, UV light or high intensive UV can then be radiated, and first barrier 1122 can be formed. First barrier seed 1121 and first barrier 1122 can be referred to as first barrier structure 112. First barrier 1122 can be formed on portions of first barrier seed 1121 located on conductive pattern 1111. The first barrier 1122 may, for example, comprise a first side 1122a, a second side 1122b opposite the first side 1122a, and a lateral side 1122c (e.g., one of a plurality thereof) that extends between the first side 1122a and the second side 1122b. In some examples, first barrier 1122 can be formed by oxidizing a portion of first barrier seed 1121, such as by reaction with Ultraviolet (UV) light. In some examples, first barrier 1122 can comprise or be referred to as an oxidized barrier or an oxide layer. First barrier 1122 can comprise an oxide, such as $TiO_2$, for example, but this is not a limitation of the present disclosure and other materials may be used (e.g., NiO, $Ni_2O_3$, CoO, $Co_2O_3$, $Co_3O_4$, $MoO_2$, $MoO_3$, MnO, $Mn_2O_3$, $Mn_3O_4$, $Au_2O_3$, $Ag_2O$, $Ta_2O_5$, etc.). In some examples, first barrier 1122 can prevent an electrical short from occurring between adjacent conductive patterns 1111 within substrate 110. For example, if a distance between conductive patterns 1111 is less than approximately 2 μm, electrical short can occur between adjacent conductive patterns 1111 due to diffusion of metal particles, e.g., copper (Cu) particles. However, in the present disclosure, the diffusion of metal particles can be prevented by forming first barrier 1122 on conductive patterns 1111. First barrier 1122 can prevent an electrical short from occurring between adjacent conductive patterns 1111, permitting a finer pitch between such adjacent conductive patterns 1111. In some examples, first barrier 1122 can have a thickness in the range from approximately 2 μm to approximately 5 μm. A ratio of a thickness of first barrier 1122 to a thickness of first barrier seed 1121 can be in a range of 3:7 to 4:6.

FIG. 2E shows a cross-sectional view of semiconductor device 100 at a later stage of manufacture. In the example shown in FIG. 2E, portions of first barrier seed 1121 can be removed, for example, between adjacent conductive patterns 1111. Such portions can be removed, for example, by dry etching or wet etching, exposing carrier 10 at such removed portions. As shown in the example implementation illustrated in FIG. 2E, the first barrier structure 112 (e.g., portions thereof) is positioned laterally between the first trace 1117 (e.g., a lateral side 1117c thereof) and the second trace 1118 (e.g., a lateral side 1118c thereof) of the first conductive pattern 1111.

FIG. 2F shows a cross-sectional view of semiconductor device 100 at a later stage of manufacture. In the example shown in FIG. 2F, dielectrics 1141 and 1142 can be formed on carrier 10. In some examples, dielectrics 1141 and 1142 can comprise or be referred to as one or more dielectrics, dielectric materials, passivation layers, insulation layers, or protection layers. Dielectrics 1141 and 1142 can comprise an electrically insulating material, such as polymer, polyimide (PI), polypropylene (PP), polyethylene (PE), benzocyclobutene (BCB), polybenzoxazole (PBO), bismaleimidetriazine (BT), a molding material, a phenol resin, epoxy, silicone or acrylate polymer. Dielectrics 1141 and 1142 can be formed using thermal oxidation, chemical vapor deposition (CVD), physical vapor deposition (PVD), atomic layer deposition (ALD), low pressure chemical vapor deposition (LPCVD), plasma enhanced chemical vapor deposition (PECVD), sheet lamination, printing, spin coating, spray coating, sintering or evaporating. In some examples, dielectrics 1141 and 1142 can be sequentially formed on carrier 10, and opening 114a can be formed in dielectrics 1141 and 1142 by patterning (e.g., during and/or after deposition of the dielectrics 1141 and 1142). Opening 114a can expose portions of first barrier 1122 over conductive patterns 1111. Although dielectrics 1141 and 1142 are shown in FIG. 2F, this is not a limitation of the present disclosure. In some examples, dielectrics 1141 and 1142 can be portions of a single or same dielectric layer. In some examples more dielectrics similar to dielectrics 1141 or 1142 can be formed on carrier 10. Patterning of dielectrics 1141 and 1142 can be performed by dry etching or wet etching. In addition, an exposed portion of first barrier 1122 can be removed by etching, for example with plasma etching, to expose contact base 1111d. In some examples, contact base 1111d can comprise an exposed area of conductive pattern 1111, or an exposed area of first barrier seed 1121 over conductive pattern 1111.

FIG. 2G shows a cross-sectional view of semiconductor device 100 at a later stage of manufacture. In the example shown in FIG. 2G, second barrier seed 1131 can be formed on dielectrics 1141 and 1142. Second barrier seed 1131 can also be formed on contact base 1111d previously exposed. Second barrier seed 1131 can be electrically connected to conductive pattern 1111 via contact base 1111d. In some examples, second barrier seed 1131 can comprise or be referred to as a conductive layer, a seed layer or a seed metal. Second barrier seed 1131 can comprise titanium (Ti), for example, but this is not a limitation of the present disclosure and other materials may be used (e.g., titanium tungsten (TiW), etc.). In some examples, second barrier seed 1131 can comprise an electrically conductive material, such as nickel (Ni), cobalt (Co), molybdenum (Mo), manganese (Mn), gold (Au), silver (Ag), tantalum (Ta), tantalum nitride (TaN), etc. Second barrier seed 1131 can be formed using, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In addition, second barrier seed 1131 can be a seed for forming second barrier 1132. Second barrier seed 1131 can be means for connecting conductive patterns 1111 and 1112 to each other within substrate 110. Second barrier seed 1131 can have a thickness in the range from approximately 2 μm to approximately 5 μm.

FIG. 2H shows a cross-sectional view of semiconductor device 100 at a later stage of manufacture, and FIG. 2I shows an enlarged cross-sectional view of a portion of FIG. 2H. In the example shown in FIGS. 2H and 2I, second barrier 1132 can be formed on portions of second barrier seed 1131. In some examples, laser masking can be formed on second barrier seed 1131, and UV laser, UV light or high intensive UV can then be irradiated on barrier seed 1131 to form second barrier 1132. Second barrier seed 1131 and second barrier 1132 can be referred to as second barrier structure 113. Second barrier 1132 can be formed on second barrier seed 1131 located over portions of dielectrics 1141 and 1142 exposed by opening 114a. In some examples, second barrier 1132 can be formed by oxidizing a portion of second barrier seed 1131 by UV light. In some examples, second barrier 1132 can comprise or be referred to as an oxidized barrier or an oxide layer. Second barrier 1132 can comprise an oxide, such as TiO2, for example, but this is not a limitation of the present disclosure and other materials may be used (e.g., NiO, Ni2O3, CoO, Co2O3, Co3O4, MoO2, MoO3, MnO, Mn2O3, Mn3O4, Au2O3, Ag2O, Ta2O5, etc.).

FIG. 2J shows a cross-sectional view of semiconductor device 100 at a later stage of manufacture, and FIG. 2K shows an enlarged cross-sectional view of a portion of FIG. 2J. In the example shown in FIGS. 2J and 2K, conductive pattern 1112, which may also for example and without limitation be referred to herein as "second conductive pat-tern 1112," can be formed on second barrier 1132 and in opening 114a. In some examples, conductive pattern 1112 can comprise or be referred to as one or more traces, vias, conductors, conductive materials, conductive paths, conductive layers, redistribution layers (RDL), wiring patterns, trace patterns, or circuit patterns. In the example implementation, the second conductive pattern 1112 may comprise a first side 1112a facing toward the second side 1111b of the first conductive pattern 1111, a second side 1112b opposite the first side 1112a, and a first lateral side 1112c (e.g., one of a plurality thereof) that extends between the first side 1112a and the second side 1112b. Conductive pattern 1112 can comprise, for example, an electrically conductive material, such as copper (Cu), aluminum (Al), palladium (Pd), titanium (Ti), tungsten (W), Ti/W, nickel (Ni), gold (Au), or silver (Ag). Conductive pattern 1112 can be formed using, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, conductive pattern 1112 can have a thickness in the range from approximately 2 μm to approximately 5 μm. In some examples, conductive pattern 1112 can be electrically connected to conductive pattern 1111 located on carrier 10 through second barrier seed 1131. Conductive pattern 1112 can transfer or laterally redistribute signals, currents or voltages in substrate 110. In an example configuration, the second side 1112b of the second conductive pattern 1112 may be free of the second barrier structure 113, and the second barrier structure 113 may cover a majority (e.g., most or all) of the first side 1112a of the second conductive pattern 1112. The second barrier structure 113 may also, for example, laterally surround most or all of the second conductive pattern 1112.

In some examples, as shown in FIG. 2L, metal seed 1133 can be formed on surfaces of second barrier seed 1131 and second barrier 1132, and conductive pattern 1112 can then be formed to fill opening 114a. Metal seed 1133 can allow conductive pattern 1112 to be formed, such as by plating. In some examples, metal seed 1133 can comprise an electrically conductive material, such as titanium (Ti), nickel (Ni), cobalt (Co), molybdenum (Mo), manganese (Mn), gold (Au), or silver (Ag). Metal seed 1133 can be formed using, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). Second barrier seed 1131, second barrier 1132 and metal seed 1133 can be referred to as second barrier structure 113'.

In some examples, the portion of barrier seed 1131 over contact base 1111d can be removed, such as by etching, prior to the formation of conductive pattern 1112 to permit conductive pattern 1112 or metal seed 1133 to directly contact conductive pattern 1111 or contact base 1111d.

Second barrier 1132 can prevent an electrical shorting between adjacent conductive patterns 1112 of substrate 110. For example, if a distance between conductive patterns 1112 is less than approximately 2 μm, electrical shorting can occur between adjacent conductive patterns 1112 due to diffusion of metal particles forming conductive patterns 1112, e.g., copper (Cu) particles. However, in the present disclosure, the diffusion of metal particles can be prevented by forming second barrier 1132 on sides of conductive patterns 1112. Second barrier 1132 can prevent electrical shorting from occurring between adjacent conductive patterns 1112, permitting a finer pitch between such adjacent conductive patterns 1112. In some examples, second barrier 1132 can have a thickness in the range from approximately 2 μm to approximately 5 μm. A ratio of a thickness of second barrier 1132 to a thickness of second barrier seed 1131 can be in a range of 3:7 to 4:6.

FIG. 2M shows a cross-sectional view of semiconductor device 100 at a later stage of manufacture. In the example shown in FIG. 2M, a portion of second barrier seed 1131 can be removed. Such portion of second barrier seed 1131 can be removed, for example by dry etching, wet etching, or chemical-mechanical polishing (CMP), and dielectric 1142 can be exposed. In some examples, portions of conductive pattern 1112 and second barrier 1132 can be removed together with second barrier seed 1131, and top surfaces of conductive pattern 1112 and second barrier structure 113 can be formed coplanar with top surface of dielectric 1142.

FIG. 2N shows a cross-sectional view of semiconductor device 100 at a later stage of manufacture. In the example shown in FIG. 2N, dielectric 1143 can be formed on conductive pattern 1112 and dielectric 1142. In some examples, dielectric 1143 can comprise or be referred to as one or more dielectric layers, dielectric materials, passivation layers, insulation layers, or protection layers. Dielectric 1143 can comprise an electrically insulating material, such as polymer, polyimide (PI), polypropylene (PP), polyethylene (PE), benzocyclobutene (BCB), polybenzoxazole (PBO), bismaleimidetriazine (BT), a molding material, a phenol resin, epoxy, silicone or acrylate polymer. In addition, dielectric 1143 can be formed using thermal oxidation, chemical vapor deposition (CVD), physical vapor deposition (PVD), atomic layer deposition (ALD), low pressure chemical vapor deposition (LPCVD), plasma enhanced chemical vapor deposition (PECVD), sheet lamination, printing, spin coating, spray coating, sintering or evaporating. Dielectrics 1141, 1142, and 1143 can be referred to as dielectric structure 114.

In some examples, a portion of dielectric 1143 can be removed to expose conductive pattern 1112, and conductive pattern 1113, which may also for example and without limitation be referred to herein as "third conductive pattern 1113," can be formed on exposed conductive pattern 1112. In the example implementation, the third conductive pattern 1113 may comprise a first side 1113a facing toward the second side 1112b of the second conductive pattern 1112, a second side 1113b opposite the first side 1113a, and a first lateral side 1113c (e.g., one of a plurality thereof) that extends between the first side 1113a and the second side 1113b. Conductive patterns 1111, 1112, and 1113 can be electrically connected to each other. In some examples, conductive pattern 1113 can comprise or be referred to as one or more traces, vias, conductors, conductive materials, conductive paths, conductive layers, redistribution layers (RDL), wiring patterns, trace patterns, or circuit patterns. Conductive pattern 1113 can comprise, for example, an electrically conductive material, such as copper (Cu), aluminum (Al), palladium (Pd), titanium (Ti), tungsten (W), Ti/W, nickel (Ni), gold (Au), or silver (Ag). Conductive pattern 1113 can be formed using, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, conductive pattern 1113 can have a thickness in the range from approximately 2 μm to approximately 5 μm. Conductive pattern 1113 can transfer or redistribute signals, currents or voltages in substrate 110.

In some examples, a portion of dielectric 1143 can be removed to expose conductive pattern 1113, and base interconnect 1114 can be formed on exposed conductive pattern 1113. In some examples, base interconnect 1114 can comprise or be referred to as a pad, a bond pad, a land, an under bump metallization (UBM), a wiring layer, a metal layer, or a pillar. Base interconnect 1114 can be electrically connected to conductive patterns 1111, 1112, and 1113. Base interconnect 1114 can provide electrical contacts between conductive patterns 1111, 1112, and 1113 and external interconnect 150. In some examples, base interconnect 1114 can comprise, for example, an electrically conductive material, such as copper (Cu), aluminum (Al), palladium (Pd), titanium (Ti), tungsten (W), Ti/W, nickel (Ni), gold (Au), or silver (Ag). Base interconnect 1114 can be formed using, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, base interconnect 1114 can have a thickness in the range from approximately 2 μm to approximately 5 μm.

FIG. 2O shows a cross-sectional view of semiconductor device 100 at a later stage of manufacture. In the example shown in FIG. 2O, carrier 10 located under conductive pattern 1111 and dielectric 1141 can be removed. In some examples, carrier 10 can be removed by grinding, heating, chemical substance, UV or physical force. In addition, a stacked structure of conductive patterns 1111, 1112, and 1113, first barrier structure 112, second barrier structure 113 and dielectric structure 114 can be inverted to then be attached to carrier 20. Conductive pattern 1111 and dielectric 1141 can be exposed, and base interconnect 1114 can be brought into contact with carrier 20. In some examples, carrier 20 can comprise silicon, glass, a metal, an adhesive film or an adhesive tape. In some examples, a stacked structure of conductive patterns 1111, 1112, and 1113, first barrier structure 112, second barrier structure 113 and dielectric structure 114 can be inverted to then be attached to carrier 20, followed by removing carrier 10.

FIG. 2P shows a cross-sectional view of semiconductor device 100 at a later stage of manufacture. In the example shown in FIG. 2P, top interconnect 1115 can be formed on conductive pattern 1111. In some examples, top interconnect 1115 can comprise or be referred to as a pad, a bond pad, a land, an under bump metallization (UBM), a bump, a wiring layer, a metal layer, or a pillar. Top interconnect 1115 can be electrically connected to conductive patterns 1111, 1112, and 1113, and base interconnect 1114. Top interconnect 1115 can provide electrical contacts for conductive patterns 1111, 1112, and 1113 and electronic device 120. In some examples, top interconnect 1115 can comprise, for example, an electrically conductive material, such as copper (Cu), aluminum (Al), palladium (Pd), titanium (Ti), tungsten (W), Ti/W, nickel (Ni), gold (Au), or silver (Ag). Top interconnect 1115 can be formed using, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, top interconnect 1115 can have a thickness in the range from approximately 2 μm to approximately 5 μm. Conductive patterns 1111, 1112, and 1113, base interconnect 1114 and top interconnect 1115 can be referred to as conductive structure 111. Conductive structure 111, first barrier structure 112, second barrier structure 113 and dielectric structure 114 can be referred to as substrate 110. In some examples, substrate 110 can have a thickness in the range from approximately 40 μm to approximately 55 μm.

In some examples, substrate 110 can be a redistribution layer ("RDL") substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride (Si3N4), silicon oxide (SiO2), and/or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. Other substrates in this disclosure can also comprise an RDL substrate.

In some examples, substrate 110 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In some examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can referred to as a printed circuit board (PCB) or a laminate substrate. Such pre-formed substrate can be formed through a semi-additive or modified-semi-additive process. Other substrates in this disclosure can also comprise a pre-formed substrate.

FIG. 2Q shows a cross-sectional view of semiconductor device 100 at a later stage of manufacture. In the example shown in FIG. 2Q, electronic device 120 can be electrically connected to conductive structure 111. In some examples, electronic device 120 can comprise or be referred to as a semiconductor die, a semiconductor chip or a semiconductor package, such as a chip scale package. Electronic device 120 can comprise, for example, a semiconducting material, such as silicon (Si). Electronic device 120 can comprise passive devices or active devices such as transistors. Electronic device 120 can comprise, for example, an electrical circuit, such as a memory, a digital signal processor (DSP), a microprocessor, a network processor, a power management processor, an audio processor, an RF circuit, a wireless baseband system-on-chip (SoC) processor, a sensor, or an application specific integrated circuit (ASIC). Electronic device 120 can be electrically connected to conductive structure 111 by, for example, a mass reflow process, a thermal compression process, or a laser bonding process. Electronic device 120 can have a height in the range from approximately 100 μm to approximately 600 μm. The electronic device 120 may, for example, comprise a first device side 120*a*, a second device side 120*b*, and a first lateral device side 120*c* (e.g., one of a plurality thereof) that extends between the first device side 120*a* and the second device side 120*b*. The substrate 110 may, for example, comprise a first substrate side 110*a*, a second substrate side 110*b*, and a lateral substrate side 110*c* (e.g., one of a plurality thereof) that extends between the first substrate side 110*a* and the second substrate side 110*b*.

Electronic device 120 can comprise device terminal 121 and device interconnect 122. Device terminal 121 can be formed on bottom surface of electronic device 120. In some examples, device terminal 121 can comprise or be referred to as a pad, a bond pad, a land, a wiring layer, a circuit pattern, a redistributed fan-in pattern or a redistributed fan-out pattern. Device terminal 121 can comprise, for example, an electrically conductive material, such as copper (Cu), aluminum (Al), palladium (Pd), titanium (Ti), tungsten (W), Ti/W, nickel (Ni), gold (Au), or silver (Ag). Device interconnect 122 can be formed at device terminal 121. In some examples, device interconnect 122 can comprise conductive balls, such as solder balls, conductive pillars, such as copper pillars, conductive posts having solder caps formed on copper pillars and/or conductive bumps. Device interconnect 122 can be electrically connected to top interconnect 1115 of conductive structure 111. Device interconnect 122 can provide an electrical contact between electronic device 120 and substrate 110. In some examples, device interconnect 122 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. Device interconnect 122 can be formed using, for example, a ball drop process, a screen-printing process, or an electroplating process.

In the example shown in FIG. 2Q, underfill 130 can be formed between electronic device 120 and substrate 110. Underfill 130 can be formed to cover device terminal 121, device interconnect 122 and top interconnect 1115. In some examples, underfill 130 can comprise or be referred to as a protective material, a dielectric or a mold compound. In some examples, underfill 130 can comprise epoxy, a thermoplastic material, a thermocurable material, polyimide, polyurethane, a polymeric material, filled epoxy, a filled thermoplastic material, a filled thermocurable material, filled polyimide, filled polyurethane, a filled polymeric material or a fluxed underfill. Underfill 130 can have a height of approximately 200 μm or less. In some examples, underfill 130 can be a portion of encapsulant 140.

In the example shown in FIG. 2Q, encapsulant 140 can encapsulate electronic device 120 on substrate 110. Encapsulant 140 can encapsulate side surfaces of electronic device 120 while exposing top surface of electronic device 120. In some examples, encapsulant 140 can encapsulate side and top surfaces of electronic device 120, and a top portion of encapsulant 140 can then be optionally grinded to expose top surface of electronic device 120.

In some examples, encapsulant 140 can comprise or be referred to as a protective material, a dielectric, a mold compound, or a package body. Encapsulant 140 can comprise a variety of encapsulating or molding materials (for example, a resin, a polymeric compound, a polymer having fillers, an epoxy resin, an epoxy resin having fillers, epoxy acrylate having fillers, or a silicon resin). Encapsulant 140 can be formed by a variety of processes, for example, a compression molding process, a liquid phase encapsulant molding process, a vacuum lamination process, a paste printing process, or a film assisted molding process. Encapsulant 140 can have a height in the range from approximately 100 μm to approximately 800 μm. Encapsulant 140 can protect electronic device 120 from external elements or environmental exposure.

FIG. 2R shows a cross-sectional view of semiconductor device 100 at a later stage of manufacture. In the example shown in FIG. 2R, carrier 20 located under substrate 110 can be removed or separated. In some examples, carrier 20 can be removed or separated from substrate 110 by grinding, heating, chemical substance, UV or physical force. Base interconnect 1114 of substrate 110 can be exposed.

In the example shown in FIG. 2R, external interconnect 150 can be connected to exposed base interconnect 1114, and semiconductor device 100 can be completed. In some examples, external interconnect 150 can comprise or be referred to as conductive bumps, balls, or pillars (such as posts or wires), and can comprise or be referred to as, for example, solder bodies, copper bodies, or solder caps. External interconnect 150 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. External interconnect 150 can be formed by, for example, a ball drop process, a screen-printing process, or an electroplating process. External interconnect 150 can have a height in the range from approximately 20 μm to approximately 200 μm. External interconnect 150 can provide an electrical connection path between semiconductor device 100 and an external component.

Figure 3:
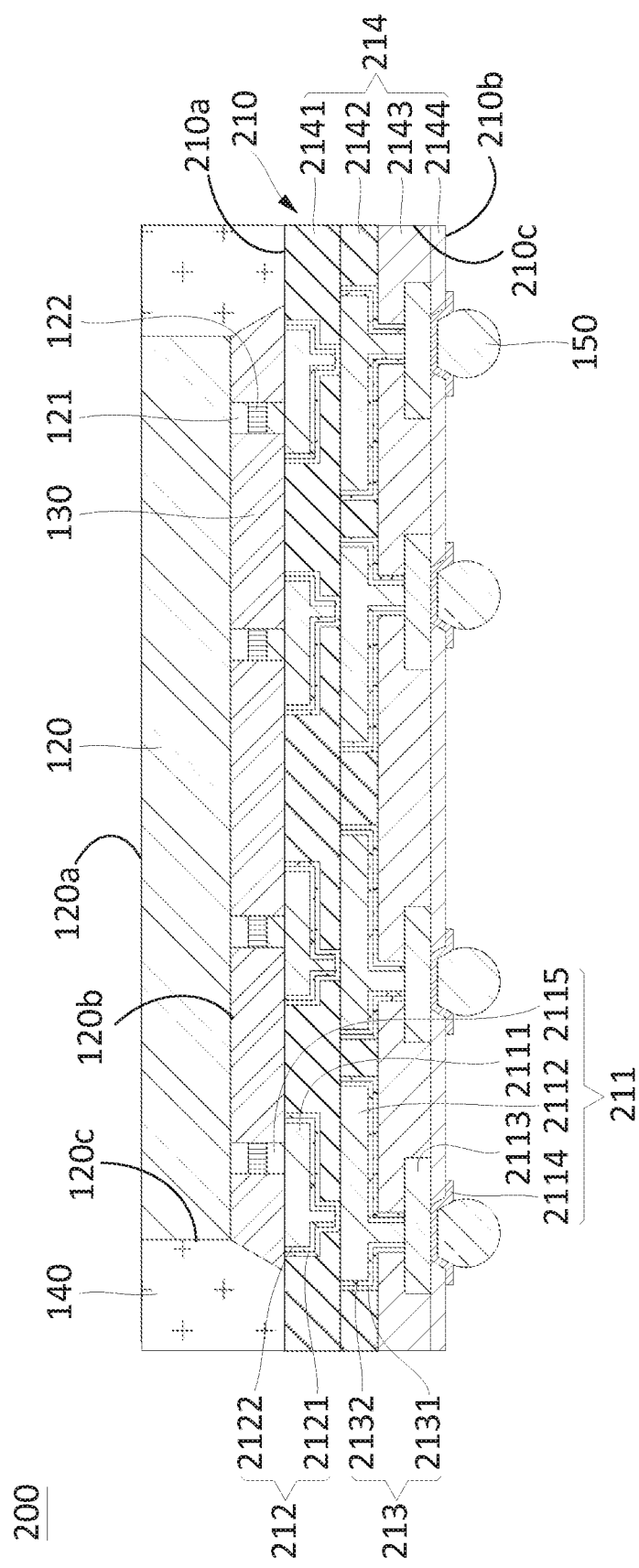
FIG. 3 shows a cross-sectional view of an example semiconductor device.

FIG. 3 shows a cross-sectional view of an example semiconductor device 200. In the example shown in FIG. 3, semiconductor device 200 can comprise substrate 210, electronic device 120, underfill 130, encapsulant 140 and external interconnect 150.

Substrate 210 can comprise conductive structure 211, first barrier structure 212, second barrier structure 213 and dielectric structure 214. Conductive structure 211 can comprise conductive patterns 2111, 2112, and 2113, base interconnect 2114, and top interconnect 2115. First barrier structure 212 can comprise first barrier seed 2121 and first barrier 2122. Second barrier structure 213 can comprise second barrier seed 2131 and second barrier 2132. Dielectric structure 214 can comprise dielectrics 2141, 2142, 2143, and 2144.

In some examples, substrate 210 can comprise corresponding elements, features, materials, or formation processes similar to those of substrate 110 previously described. For example, items 211, 2111, 2112, 2113, 2114, 2115, 212, 2121, 2122, 213, 2131, 2132, 214, 2141, 2142, 2143 of substrate 210 can respectively correspond or be similar to items 111, 1111, 1112, 1113, 1114, 1115, 112, 1121, 1122, 113, 1131, 1132, 114, 1141, 1142, 1143 of substrate 110 previously described. Substrate 210 also comprises dielectric 2144.

The electronic device 120 may, for example, comprise a first device side 120a, a second device side 120b, and a first lateral device side 120c (e.g., one of a plurality thereof) that extends between the first device side 120a and the second device side 120b. The substrate 210 may, for example, comprise a first substrate side 210a, a second substrate side 210b, and a lateral substrate side 210c (e.g., one of a plurality thereof) that extends between the first substrate side 210a and the second substrate side 210b.

Figure 4A:
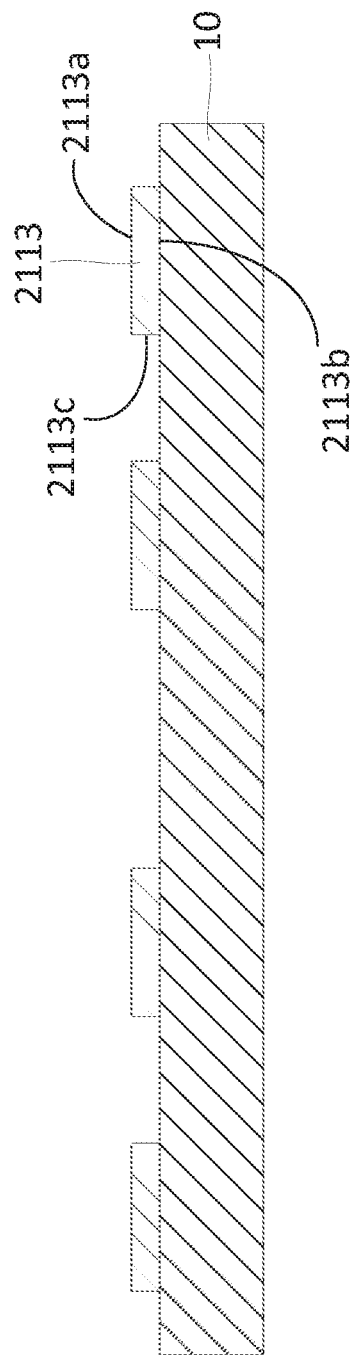
FIGS. 4A to 4T show cross-sectional views of an example method for manufacturing an example semiconductor device.
Figure 4B:
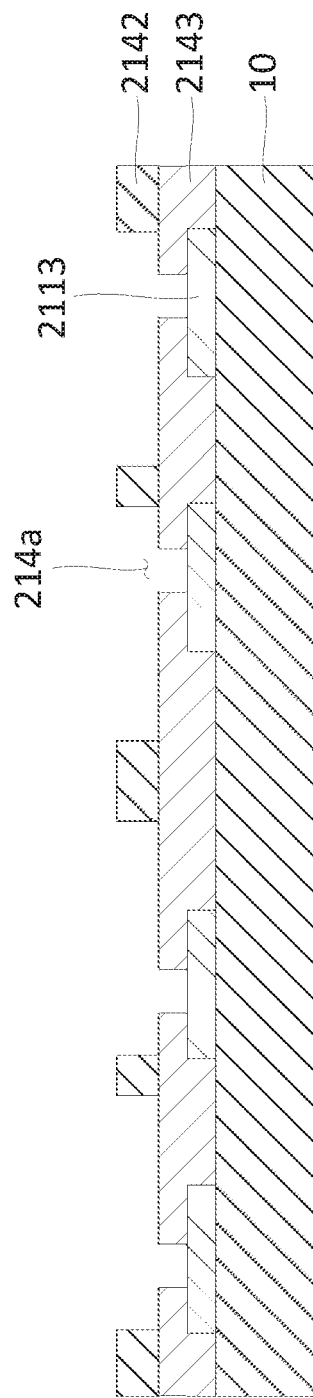
Figure 4C:
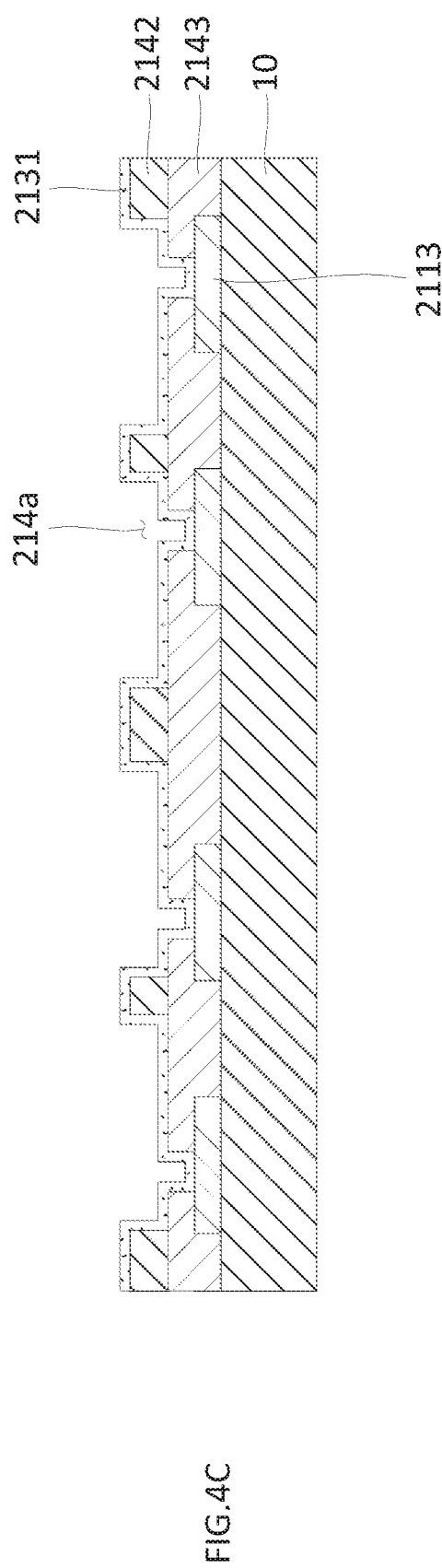
Figure 4D:
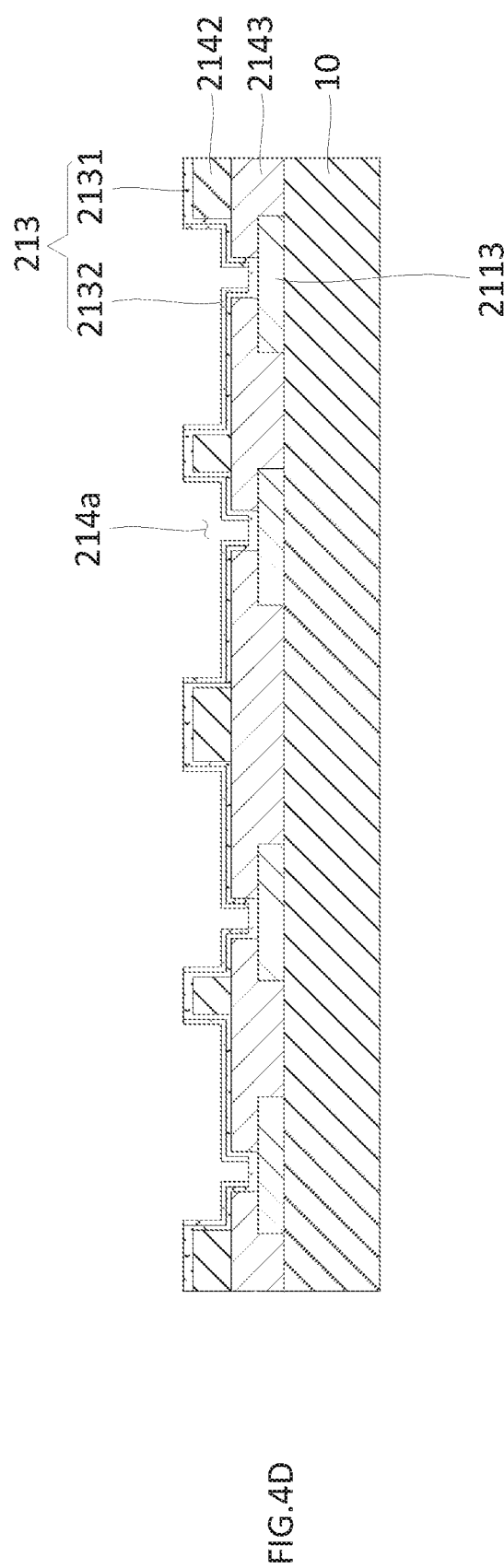
Figure 4E:
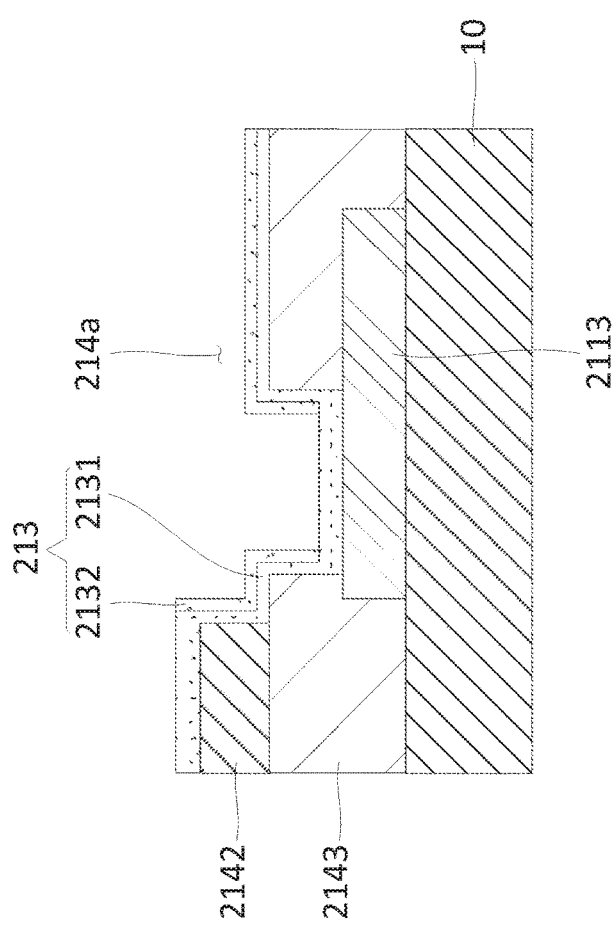
Figure 4F:
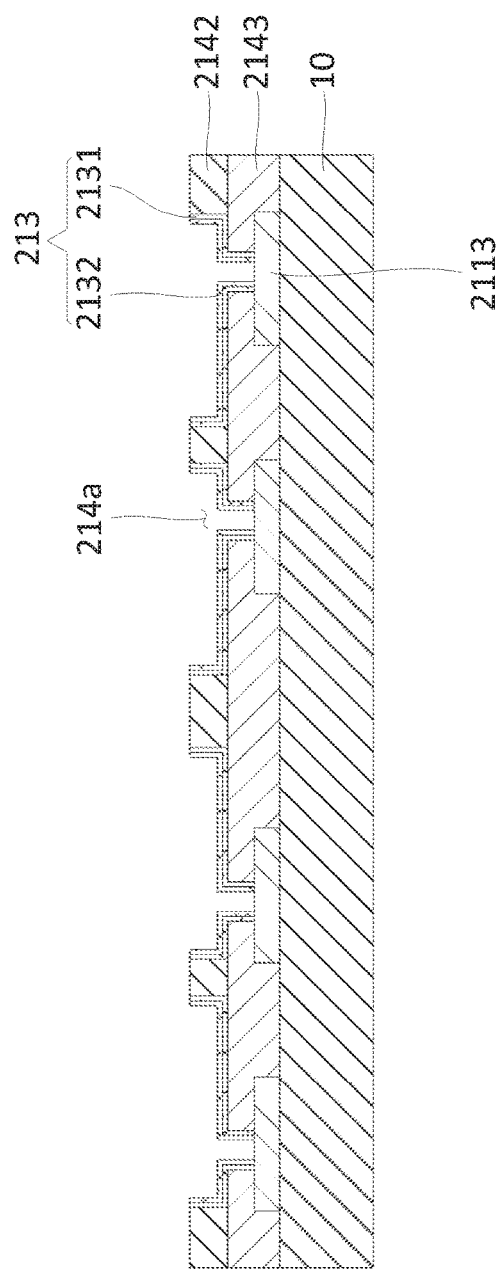
Figure 4G:
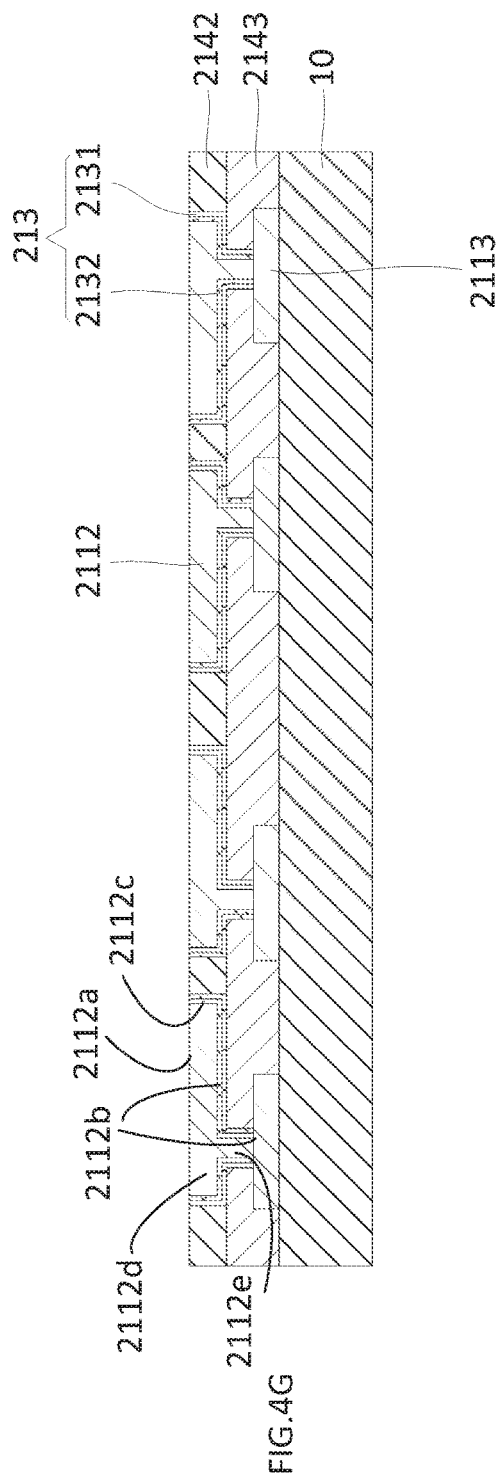
Figure 4H:
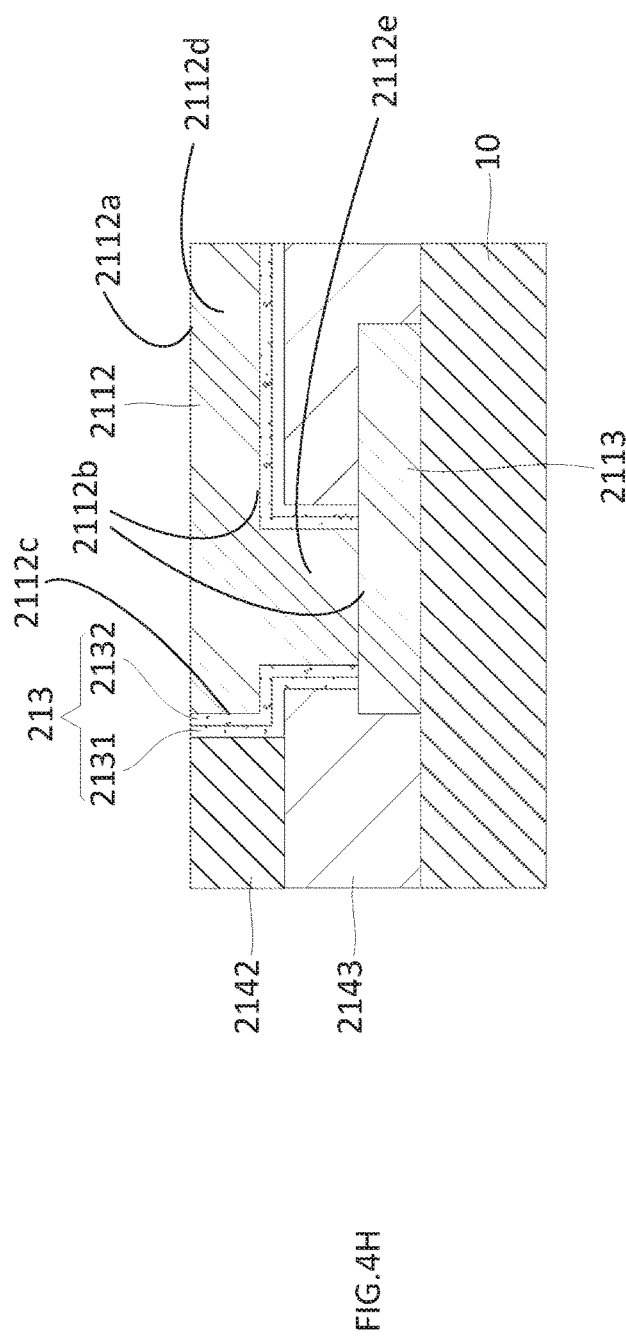
Figure 4I:
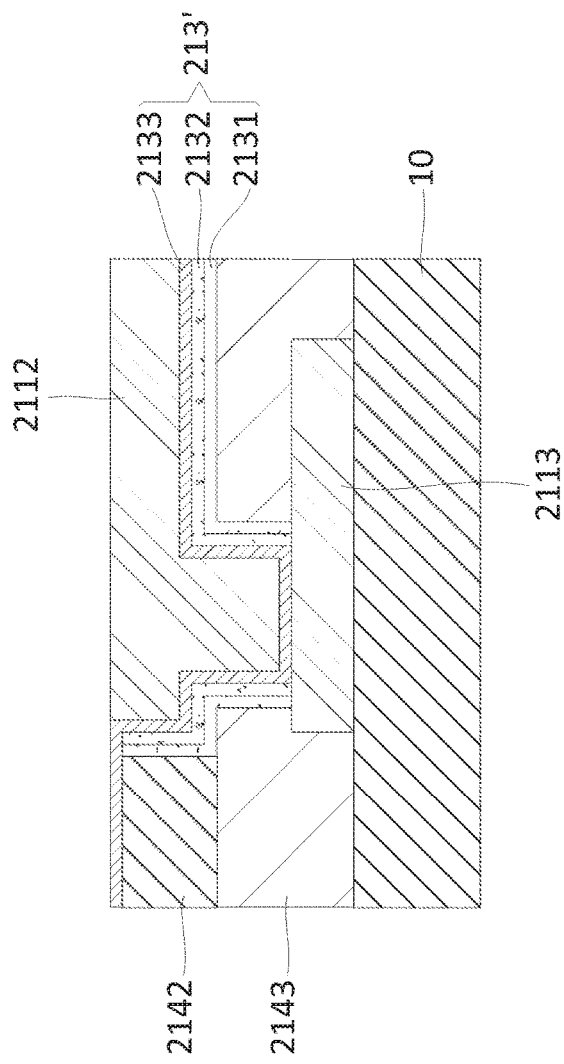
Figure 4J:
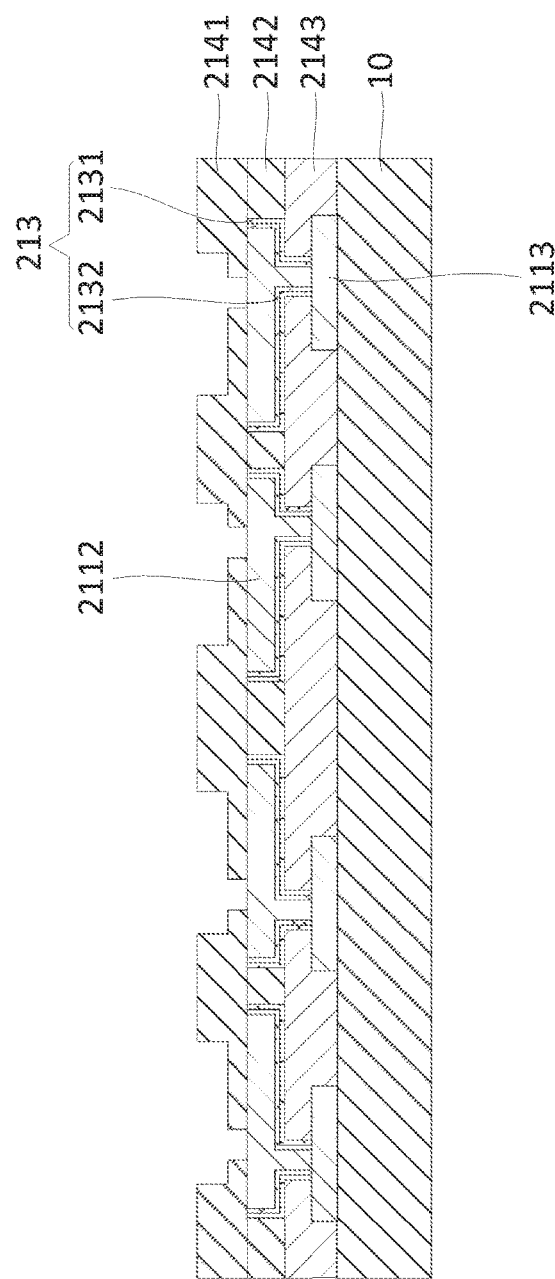
Figure 4M:
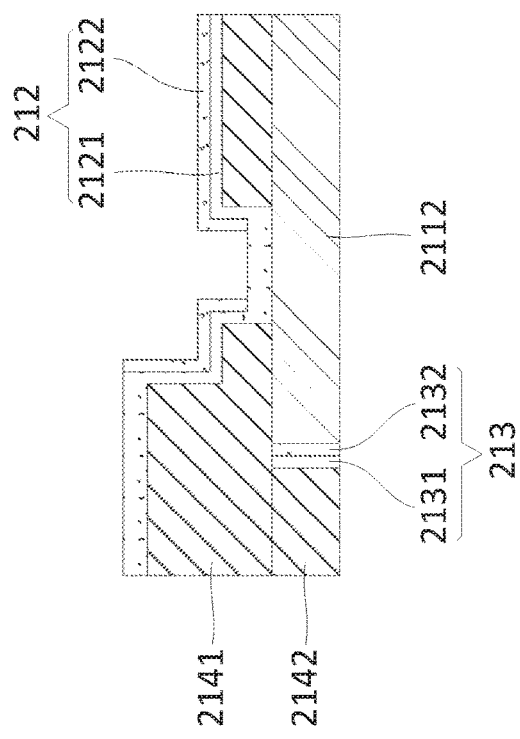
Figure 4N:
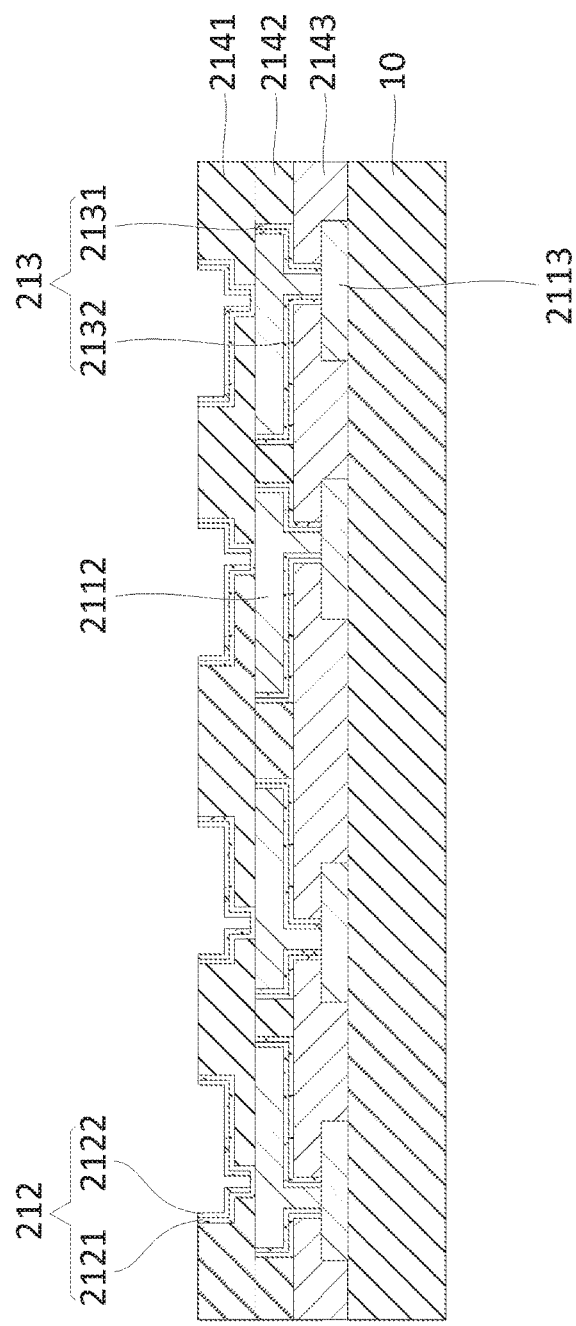
Figure 4O:
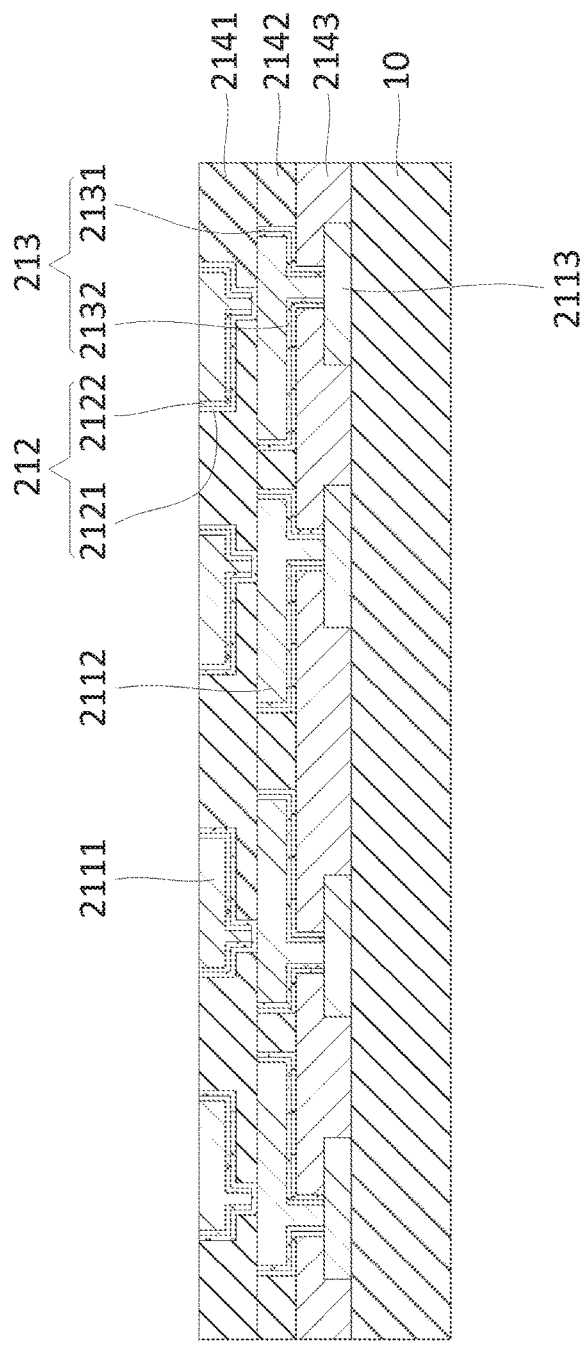
Figure 4P:
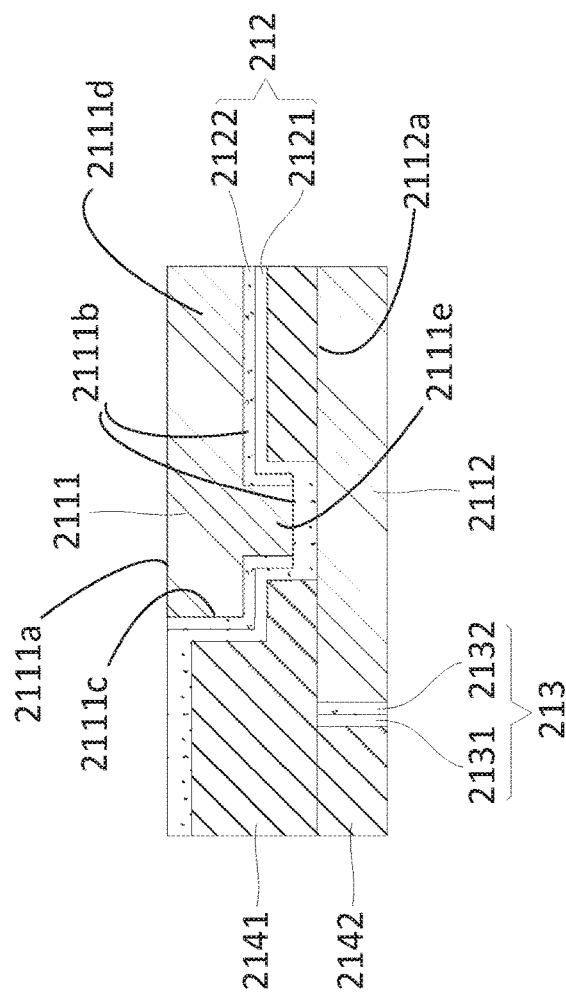

In an example implementation and referring to FIGS. 3, 4O, and 4P, the first conductive pattern 2111 may comprise a first side 2111a facing toward the electronic device 120, a second side 2111b opposite the first side 2111a, and a first lateral side 2111c (e.g., one of a plurality thereof) that extends between the first side 2111a and the second side 2111b. Also, in the example implementation and referring to FIGS. 3, 4G, and 4H, the second conductive pattern 2112 may comprise a first side 2112a facing toward the second side 2111b of the first conductive pattern 2111, a second side 2112b opposite the first side 2112a and facing the third conductive pattern 2113, and a first lateral side 2112c (e.g., one of a plurality thereof) that extends between the first side 2112a and the second side 2112b. Additionally, in the example implementation and referring to FIGS. 3 and 4A, the third conductive pattern 2113 may comprise a first side 2113a facing toward the second side 2112b of the second conductive pattern 2112, a second side 2113b opposite the first side 2113a, and a first lateral side 2113c (e.g., one of a plurality thereof) that extends between the first side 2113a and the second side 2113b.

In an example implementation, the first barrier structure 212 may inhibit (e.g., substantially reduce, eliminate, etc.) lateral migration of metal between laterally adjacent segments of the first conductive pattern 2111. The first barrier structure 212 may also inhibit vertical migration of metal between segments of the first conductive pattern 2111 and other conductive patterns (e.g., second conductive pattern 2112, third conductive pattern 2113, etc.). Similarly, the second barrier structure 213 may inhibit (e.g., substantially reduce, eliminate, etc.) lateral migration of metal between laterally adjacent segments of the second conductive pattern 2112. The second barrier structure 213 may also inhibit vertical migration of metal between segments of the second conductive pattern 2112 and other conductive patterns (e.g., first conductive pattern 2111, second conductive pattern 2113, etc.).

In an example configuration, the first side 2111a of the first conductive pattern 2111 may be free of the first barrier structure 112, and the first barrier structure 112 may cover a majority (e.g., most or all) of the second side 2111b of the first conductive pattern 2111. The first barrier structure 112 may also, for example, laterally surround most or all of the first conductive pattern 2111. The first conductive pattern 2111 may, for example, comprise a trace 2111d and a via 2111e. In an example implementation, the first barrier structure 212 may laterally surround the trace 2111d and the via 2111e.

In an example configuration, the first side 2112a of the second conductive pattern 2112 may be free of the second barrier structure 213, and the second barrier structure 213 may cover a majority (e.g., most or all) of the second side 2112b of the second conductive pattern 2112. The second barrier structure 213 may also, for example, laterally surround most or all of the second conductive pattern 2112 The second conductive pattern 2112 may, for example, comprises a trace 2112d and a via 2112e. In an example implementation, the second barrier structure 213 may laterally surround the trace 2112d and the via 2112e.

In some examples, substrate 210, underfill 130, encapsulant 140 and external interconnect 150 can comprise or be referred to as a semiconductor package or a package, which can protect electronic device 120 from external elements and/or environmental exposure. Semiconductor package can provide electrical coupling between an external component and electronic device 120.

Figure 4Q:
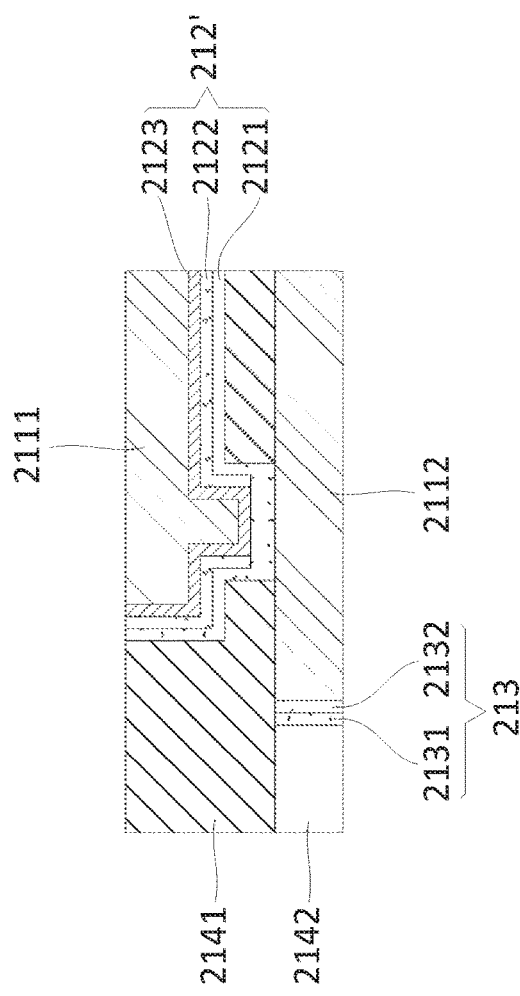
Figure 4R:
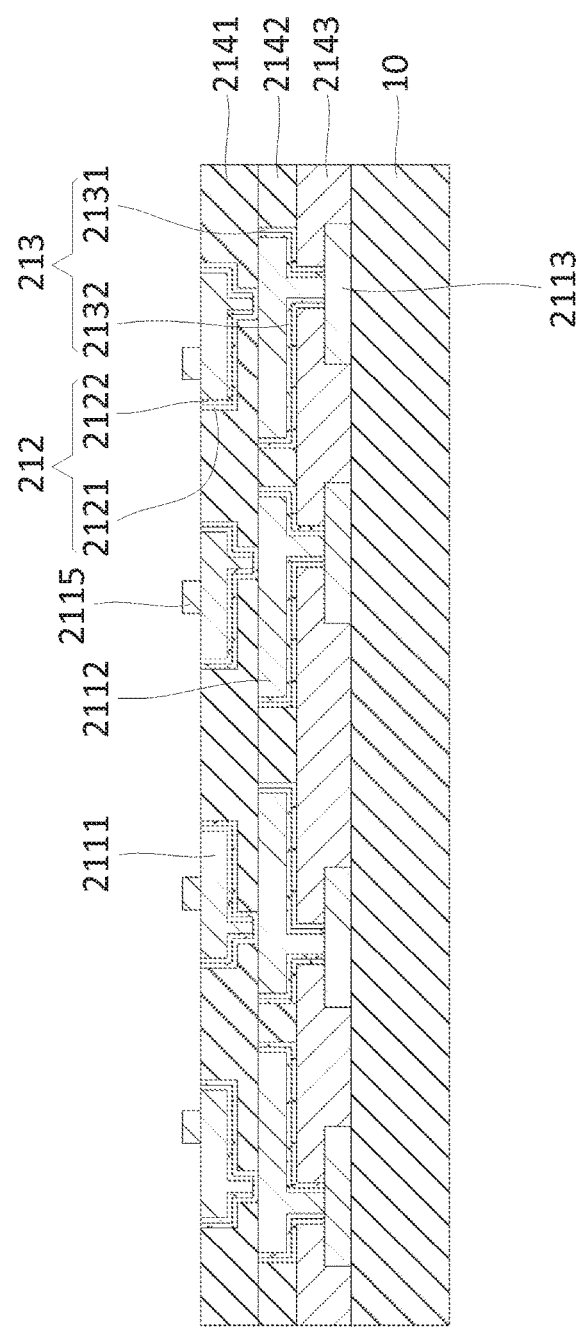
Figure 4S:
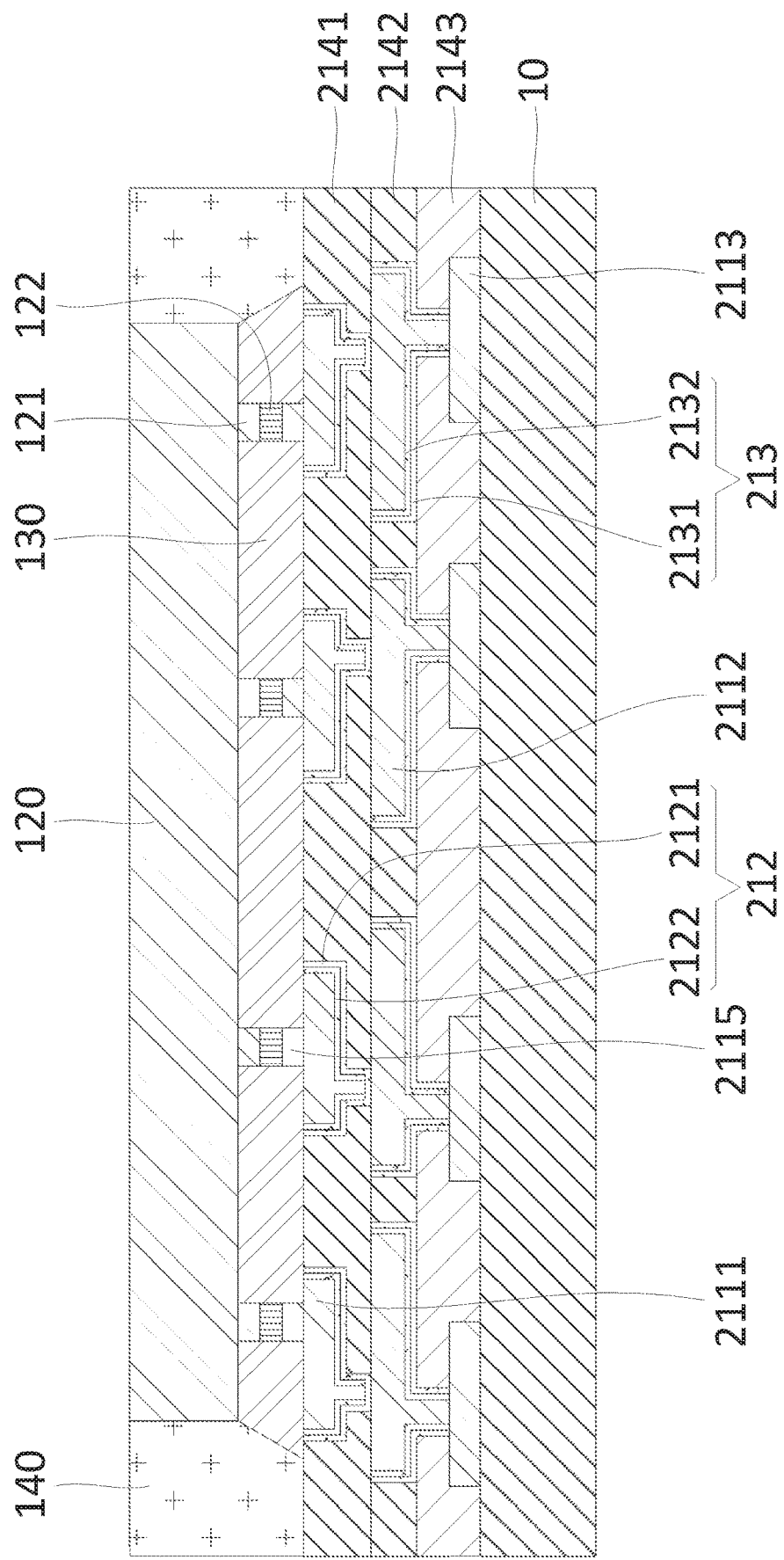
Figure 4T:
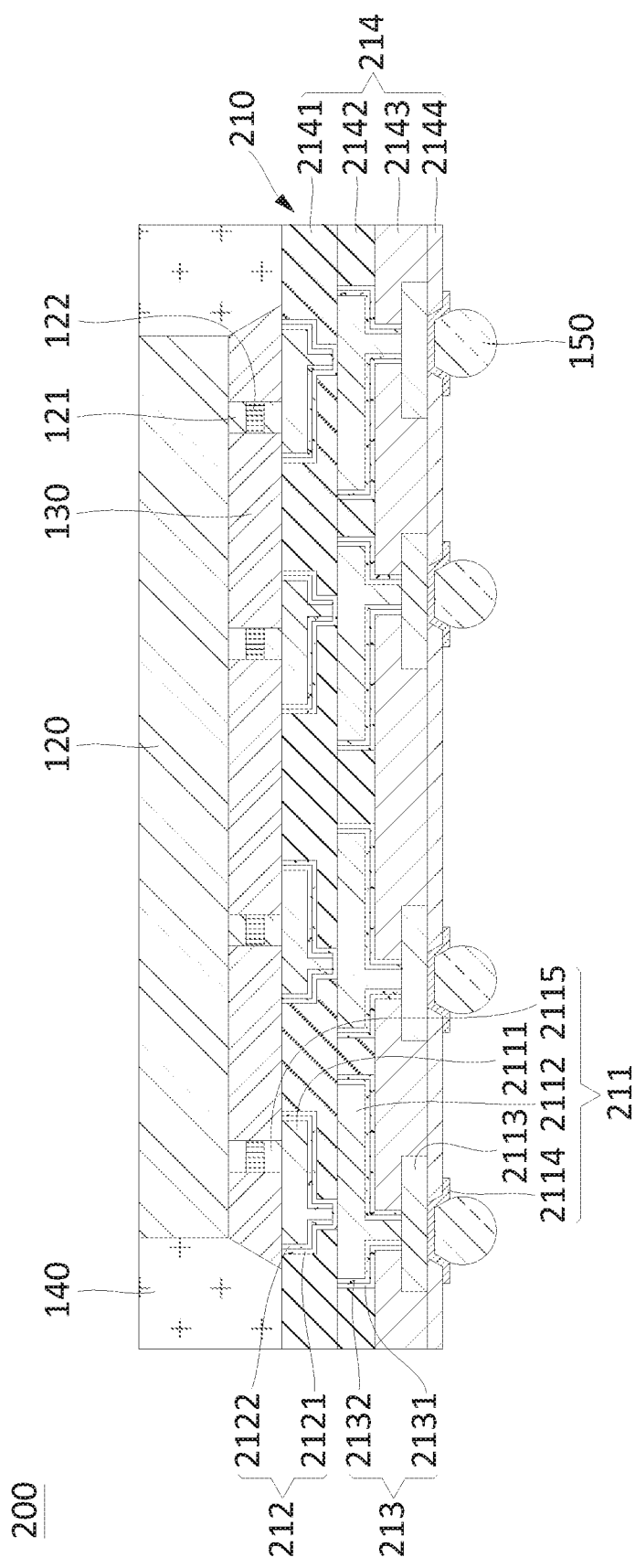

FIGS. 4A to 4T show cross-sectional views of an example method for manufacturing an example semiconductor device 200. FIG. 4A shows a cross-sectional view of semiconductor device 200 at an early stage of manufacture.

In the example shown in FIG. 4A, conductive pattern 2113, which may for example and without limitation be referred to herein as "third conductive pattern 2113," can be formed on a top surface of carrier 10. In some examples, carrier 10 can comprise silicon, glass, a metal, an adhesive film or an adhesive tape. In the example implementation, the third conductive pattern 2113 may comprise a second side 2113b facing the top surface of the carrier 10, a first side 2113a opposite the second side 2113b, and a first lateral side 2113c (e.g., one of a plurality thereof) that extends between the first side 2113a and the second side 2113b. In some examples, conductive pattern 2113 can comprise corresponding elements, features, materials, or formation processes similar to those of conductive pattern 1113 previously described. In some examples, conductive pattern 2113 can have a thickness in the range from approximately 2 µm to approximately 5 µm.

FIG. 4B shows a cross-sectional view of semiconductor device 200 at a later stage of manufacture. In the example shown in FIG. 4B, dielectrics 2143 and 2142 can be formed on carrier 10. In some examples, dielectrics 2143, 2142 can comprise corresponding elements, features, materials, or formation processes similar to those of dielectrics 1143, 1142 previously described. In some examples, dielectrics 2143 and 2142 can be sequentially formed on carrier 10, and opening 214a can be formed in dielectrics 2143 and 2142 by patterning. Opening 214a can expose portions of dielectrics 2143 and 2142 and conductive pattern 2113. Although two of dielectrics 2143 and 2142 are shown in FIG. 4B, but this is not a limitation of the present disclosure. In some examples, a same or single dielectric layer can comprise dielectrics 2142 and 2143. In some examples, dielectrics 2143, 2143 can comprise more than two dielectric layers. In some examples, patterning of dielectrics 2143 and 2142 can be performed by dry etching or wet etching.

FIG. 4C shows a cross-sectional view of semiconductor device 200 at a later stage of manufacture. In the example shown in FIG. 4C, second barrier seed 2131 can be entirely formed on top surfaces of dielectrics 2143 and 2142. In addition, second barrier seed 2131 can also be formed on exposed top surface of conductive pattern 2113. Second barrier seed 2131 can be electrically connected to conductive pattern 2113. In some examples, second barrier seed 2131 can comprise corresponding elements, features, materials, or formation processes similar to those of second barrier seed 1131 previously described. Second barrier seed 2131 can be a seed for forming second barrier 2132. Second barrier seed 2131 can be a junction connecting conductive patterns 2113 and 2112 to each other within substrate 210. Second barrier seed 2131 can have a thickness in the range from approximately 2 µm to approximately 5 µm.

FIG. 4D shows a cross-sectional view of semiconductor device 200 at a later stage of manufacture, and FIG. 4E shows an enlarged cross-sectional view of a portion of FIG. 4D. In the example shown in FIGS. 4D and 4E, second barrier 2132 can be formed on a region of second barrier seed 2131. In some examples, laser masking can be formed on second barrier seed 2131, and UV laser, UV light or high intensive UV can then be irradiated, and second barrier 2132 can be formed. Second barrier 2132 can be formed on second barrier seed 2131 located in dielectrics 2143 and 2142 exposed through opening 214a. Second barrier seed 2131 and second barrier 2132 can be referred to as second barrier structure 213. In some examples, second barrier 2132 can comprise corresponding elements, features, materials, or formation processes similar to those of second barrier 1132 previously described. Second barrier 2132 can prevent an electrical short from occurring between adjacent conductive patterns 2112 within substrate 210. In some examples, second barrier 2132 can have a thickness in the range from approximately 2 µm to approximately 5 µm. A ratio of a thickness of second barrier 2132 to a thickness of second barrier seed 2131 can be in a range of 3:7 to 4:6.

FIG. 4F shows a cross-sectional view of semiconductor device 200 at a later stage of manufacture. In the example shown in FIG. 4F, a portion of second barrier seed 2131 can be removed. Second barrier seed 2131 can be removed by dry etching or wet etching. Second barrier seed 2131 located on dielectric 2142 and conductive pattern 2113 can be removed to expose dielectric 2142 and conductive pattern 2113. In some examples, only the portion of second barrier seed 2131 over dielectric 2142 is removed, and the portion of second barrier seed 2131 on the exposed top surface of conductive pattern 2113 can remain. In some examples, a portion of second barrier 2132 can be removed together with second barrier seed 2131, and top surface of second barrier structure 213 can be formed coplanar with top surface of dielectric 2142.

FIG. 4G shows a cross-sectional view of semiconductor device 200 at a later stage of manufacture, and FIG. 4H shows an enlarged cross-sectional view of a portion of FIG. 4G. In the example shown in FIGS. 4G and 4H, conductive pattern 2112, which may for example and without limitation be referred to herein as "second conductive pattern 2112," can be formed in second barrier 2132 to fill opening 214a. In some examples, conductive pattern 2112 can comprise corresponding elements, features, materials, or formation processes similar to those of conductive pattern 1112 previously described. In the example implementation, the second conductive pattern 2112 may comprise a second side 2112b facing toward the first side 2113a of the third conductive pattern 2113, a first side 2112a opposite the second side 2112b, and a first lateral side 2112c (e.g., one of a plurality thereof) that extends between the first side 2112a and the second side 2112b. In some examples, conductive pattern 2112 can have a thickness in the range from approximately 2 μm to approximately 5 μm. Conductive pattern 2112 can be electrically connected to conductive pattern 2113. Conductive pattern 2112 can transfer or redistribute signals, currents or voltages in substrate 210. In an example configuration, the first side 2112a of the second conductive pattern 2112 may be free of the second barrier structure 213, and the second barrier structure 213 may cover a majority (e.g., most or all) of the second side 2112b of the second conductive pattern 2112. The second barrier structure 213 may also, for example, laterally surround most or all of the second conductive pattern 2112.

In some examples, as shown in FIG. 4I, metal seed 2133 can be formed on a surface of second barrier 2132, and conductive pattern 2112 can then be formed to fill opening 214a. In some examples, metal seed 2133 can be entirely formed in opening 214a and on top surfaces of dielectric 2142. In some examples, metal seed 2133 can comprise corresponding elements, features, materials, or formation processes similar to those of metal seed 1133 previously described. Metal seed 2133 can allow conductive pattern 2112 to be easily formed on surface of second barrier 2132. Second barrier seed 2131, second barrier 2132 and metal seed 2133 can be referred to as second barrier structure 213'.

FIG. 4J shows a cross-sectional view of semiconductor device 200 at a later stage of manufacture. In the example shown in FIG. 4J, dielectric 2141 can be formed on conductive pattern 2112 and dielectric 2142. In some examples, dielectric 2141 can comprise one or more dielectric layers. In some examples, dielectric 2141 can comprise corresponding elements, features, materials, or formation processes similar to those of dielectric 1141 previously described. In some examples, a portion of dielectric 2141 can be removed to expose a portion of conductive pattern 2112. Dielectric 2141 can be removed by, for example, dry etching or wet etching.

FIG. 4K shows a cross-sectional view of semiconductor device 200 at a later stage of manufacture. In the example shown in FIG. 4K, first barrier seed 2121 can be formed on top surface of dielectric 2141. First barrier seed 2121 can be formed to cover exposed conductive pattern 2112. In some examples, first barrier seed 2121 can comprise corresponding elements, features, materials, or formation processes similar to those of first barrier seed 1121 previously described. First barrier seed 2121 can have a thickness in the range from approximately 2 μm to approximately 5 μm.

FIG. 4L shows a cross-sectional view of semiconductor device 200 at a later stage of manufacture, and FIG. 4M shows an enlarged cross-sectional view of a portion of FIG. 4L. In the example shown in FIGS. 4L and 4M, first barrier 2122 can be formed on a region of first barrier seed 2121. In some examples, laser masking can be formed on first barrier seed 2121, and UV laser, UV light or high intensive UV can then be irradiated, and first barrier 2122 can be formed. First barrier seed 2121 and first barrier 2122 can be referred to as first barrier structure 212. First barrier 2122 formed such as to leave exposed a region of first barrier seed 2121 over conductive pattern 2112. In some examples, first barrier 2122 can comprise corresponding elements, features, materials, or formation processes similar to those of first barrier 1122 previously described. First barrier 2122 can prevent an electrical shot from occurring between adjacent conductive patterns 2111 within substrate 210. In some examples, first barrier 2122 can have a thickness in the range from approximately 2 μm to approximately 5 μm. A ratio of a thickness of first barrier 2122 to a thickness of first barrier seed 2121 can be in a range of 3:7 to 4:6.

FIG. 4N shows a cross-sectional view of semiconductor device 200 at a later stage of manufacture. In the example shown in FIG. 4N, a portion of first barrier seed 2121 can be removed. In some examples, first barrier seed 2121 can be removed by dry etching or wet etching. In some examples, first barrier seed 2121 located on dielectric 2141 can be removed to expose dielectric 2141. In some examples, a portion of first barrier seed 2121 contacting or located on conductive pattern 2112 can also be removed to expose a portion of conductive pattern 2112. In some examples, a portion of first barrier 2122 can be removed together with first barrier seed 2121, and top surface of first barrier structure 212 can be formed coplanar with top surface of dielectric 2141.

FIG. 4O shows a cross-sectional view of semiconductor device 200 at a later stage of manufacture, and FIG. 4P shows an enlarged cross-sectional view of a portion of FIG. 4O. In the example shown in FIGS. 4O and 4P, conductive pattern 2111 can be formed in first barrier 2122. In some examples, conductive pattern 2111 can comprise corresponding elements, features, materials, or formation processes similar to those of conductive pattern 1111 previously described. In an example implementation, the first conductive pattern 2111 may comprise a second side 2111b facing toward the first side 2112a of the second conductive pattern 2112, a first side 2111a opposite the second side 2111b, and a first lateral side 2111c (e.g., one of a plurality thereof) that extends between the first side 2111a and the second side 2111b. In some examples, conductive pattern 2111 can have a thickness in the range from approximately 2 μm to approximately 5 μm. In some examples, conductive pattern 2111 can be electrically connected to conductive pattern 2112 through first barrier seed 2121. In some examples, conductive pattern 2111 can be directly connect to an exposed portion of conductive pattern 2112. Conductive pattern 2111 can transfer or laterally redistribute signals, currents or voltages in substrate 110. In an example configuration, the first side 2111a of the first conductive pattern 2111 may be free of the first barrier structure 212, and the first barrier structure 212 may cover a majority (e.g., most or all) of the second side 2111b of the first conductive pattern 2111. The first barrier structure 212 may also, for example, laterally surround most or all of the first conductive pattern 2111. The first conductive pattern 2111 may, for example, comprise a trace 2111d and a via 2111e. In an example implementation, the first barrier structure 212 may laterally surround the trace 2111*d* and the via 2111*e*.

In some examples, as shown in FIG. 4Q, metal seed 2123 can be formed on surfaces of first barrier 2122 and first barrier seed 2121, and conductive pattern 2111 can then be formed on metal seed 2123. In some examples, metal seed 2123 can comprise corresponding elements, features, materials, or formation processes similar to those of metal seed 1133 previously described. Metal seed 2123 can allow conductive pattern 2111 to be easily formed on surface of first barrier 2122. In addition, first barrier seed 2121, first barrier 2122 and metal seed 2123 can be referred to as first barrier structure 212'.

FIG. 4R shows a cross-sectional view of semiconductor device 200 at a later stage of manufacture. In the example shown in FIG. 4R, top interconnect 2115 can be formed on conductive pattern 2111. In some examples, top interconnects 2115 can comprise corresponding elements, features, materials, or formation processes similar to those of top interconnects 1115 previously described. In some examples, top interconnect 2115 can have a thickness in the range from approximately 2 μm to approximately 5 μm.

FIG. 4S shows a cross-sectional view of semiconductor device 200 at a later stage of manufacture. In the example shown in FIG. 4S, electronic device 120 can be electrically connected to top interconnect 2115. Electronic device 120 can comprise device terminal 121 and device interconnect 122. Device interconnect 122 can be electrically connected to top interconnect 2115. Device interconnect 122 can provide an electrical contact between electronic device 120 and substrate 210. In some examples, underfill 130 can be formed between electronic device 120 and substrate 210. Underfill 130 can be formed to cover device terminal 121, device interconnect 122 and top interconnect 2115. In some examples, encapsulant 140 can encapsulate electronic device 120 on substrate 210.

FIG. 4T shows a cross-sectional view of semiconductor device 200 at a later stage of manufacture. In the example shown in FIG. 4T, carrier 10 located under conductive pattern 2113 and dielectric 2143 can be removed. In some examples, carrier 10 can be removed by grinding, heating, chemical substance, UV or physical force. Conductive pattern 2113 and dielectric 2143 can be exposed. In some examples, dielectric 2144 can be formed on conductive pattern 2113 and dielectric 2143. In some examples, dielectric 2144 can comprise corresponding elements, features, materials, or formation processes similar to those of dielectric 2141 previously described. Dielectrics 2141, 2142, 2143, and 2144 can be referred to as dielectric structure 214.

In some examples, a portion of dielectric 2144 can be removed to expose conductive pattern 2113, and base interconnect 2114 can be formed on exposed conductive pattern 2113. In some examples, base interconnects 2114 can comprise corresponding elements, features, materials, or formation processes similar to those of base interconnects 1114 previously described. Base interconnect 2114 can provide electrical contacts between conductive patterns 2111, 2112 and 2113 and external interconnect 150. Conductive patterns 2111, 2112 and 2113, base interconnect 2114 and top interconnect 2115 can be referred to as conductive structure 211.

In some examples, external interconnect 150 can be connected to base interconnect 2114, and semiconductor device 200 can be completed. External interconnect 150 can provide an electrical connection path between semiconductor device 200 and an external component.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

The invention claimed is:

1. A device comprising:
an electronic device comprising a first device side, a second device side opposite the first device side, and a first lateral device side that extends between the first device side and the second device side; and
a substrate comprising a first substrate side facing toward the second device side, a second substrate side opposite the first substrate side, and a first lateral substrate side that extends between the first substrate side and the second substrate side,
wherein the substrate comprises:
a first conductive pattern (CP1) comprising a first CP1 side facing toward the electronic device, a second CP1 side opposite the first CP1 side, and a first lateral CP1 side that extends between the first CP1 side and the second CP1 side;
a first barrier structure on the first lateral CP1 side, where the first barrier structure comprises a metal;
a second conductive pattern (CP2) comprising a first CP2 side facing toward the second CP1 side, a second CP2 side opposite the first CP2 side, and a first lateral CP2 side that extends between the first CP2 side and the second CP2 side; and
a first dielectric that laterally surrounds an entirety of the second conductive pattern (CP2),
wherein the first CP2 lateral side is free of a metal barrier structure.

2. The device of claim 1, wherein:
the first conductive pattern (CP1) comprises a first copper layer;
the second conductive pattern (CP2) comprises a second copper layer; and
the first barrier structure comprises an oxide that contacts the first lateral CP1 side.

3. The device of claim 2, wherein the first barrier structure inhibits lateral migration of copper of the first copper layer.

4. The device of claim 1, comprising a dielectric that contacts a portion of the second CP2 side.

5. The device of claim 1, wherein:
the first CP1 side is free of the first barrier structure; and
the first barrier structure covers a majority of the second CP1 side.

6. The device of claim 1, wherein:
the first conductive pattern (CP1) comprises a CP1 trace, and a CP1 via extending vertically from the CP1 trace;
the first barrier structure laterally surrounds the CP1 trace and the CP1 via; and
the substrate comprises a dielectric material, where a single layer of the dielectric material laterally surrounds the CP1 trace and the CP1 via.

7. The device of claim 1, wherein the first barrier structure comprises:
a first barrier oxide contacting the first lateral CP1 side, the first barrier oxide comprising a first lateral side that faces laterally away from the first lateral CP1 side; and
a first seed metal that contacts the first lateral side of the first barrier oxide.

8. The device of claim 1, wherein the first barrier structure covers most of the second CP1 side.

9. The device of claim 1, wherein:
the substrate is free of semiconductor material; and
the electronic device is soldered to the substrate.

10. The device of claim 1, further comprising a third conductive pattern (CP3) comprising:
a first CP3 side facing toward the second CP1 side, a second CP3 side opposite the first CP3 side and facing toward the first CP2 side, and a first lateral CP3 side that extends between the first CP3 side and the second CP3 side; and
a second barrier structure on the first lateral CP3 side, where the second barrier structure comprises metal, wherein:
the first barrier structure covers a majority of the second CP1 side; and
the second barrier structure covers a majority of the first CP3 side or a majority of the second CP3 side.

11. The device of claim 1, further comprising a base interconnect coupled to the second CP2 side, where the base interconnect comprises a pad.

12. A device comprising:
an electronic device comprising a first device side, a second device side opposite the first device side, and a first lateral device side that extends between the first device side and the second device side; and
a substrate comprising a first substrate side facing toward the second device side, a second substrate side opposite the first substrate side, and a first lateral substrate side that extends between the first substrate side and the second substrate side,
wherein the substrate comprises:
a first metal trace (MT1) comprising a first MT1 side facing toward the electronic device, a second MT1 side opposite the first MT1 side, and a first lateral MT1 side that extends between the first MT1 side and the second MT1 side;
a second metal trace (MT2) comprising a first MT2 side facing toward the electronic device, a second MT2 side opposite the first MT2 side, and a first lateral MT2 side that extends between the first MT2 side and the second MT2 side; and
a first barrier structure on the first lateral MT1 side and positioned laterally between the first lateral MT1 side and the first lateral MT2 side, where the first barrier structure comprises:
a metal layer; and
an oxide layer, where the oxide layer contacts the first lateral MT1 side.

13. The device of claim 12, further comprising a second barrier structure on the first lateral MT2 side and positioned laterally between the first lateral MT2 side and the first lateral MT1 side, where the second barrier structure comprises:
a second metal layer; and
a second oxide layer, where the second oxide layer contacts the first lateral MT2 side.

14. The device of claim 13, further comprising:
a first conductive via extending from the second MT1 side; and
a dielectric material positioned laterally between the first barrier structure and the second barrier structure, where the dielectric material comprises a single layer of a dielectric material that laterally surrounds an entirety of the first metal trace (MT1) and the first conductive via.

15. The device of claim 12, wherein:
the first metal trace comprises copper;
the second metal trace comprises copper;
the metal layer of the first barrier structure comprises titanium; and
the oxide layer of the first barrier structure comprises titanium oxide.

16. The device of claim 12, comprising an underfill directly between the electronic device and the substrate.

17. A method of making a device, the method comprising:
providing an electronic device comprising a first device side, a second device side opposite the first device side, and a first lateral device side that extends between the first device side and the second device side; and
providing a substrate comprising a first substrate side facing toward the second device side, a second substrate side opposite the first substrate side, and a first lateral substrate side that extends between the first substrate side and the second substrate side,
wherein the substrate comprises:
a first conductive pattern (CP1) comprising a first CP1 side facing toward the electronic device, a second CP1 side opposite the first CP1 side, and a first lateral CP1 side that extends between the first CP1 side and the second CP1 side;
a first barrier structure on the first lateral CP1 side, where the first barrier structure comprises metal;
a second conductive pattern (CP2) comprising a first CP2 side facing toward the second CP1 side, a second CP2 side opposite the first CP2 side, and a first lateral CP2 side that extends between the first CP2 side and the second CP2 side; and
a first dielectric that laterally surrounds an entirety of the second conductive pattern (CP2),
wherein the first CP2 lateral side is free of a metal barrier structure.

18. The method of claim 17, wherein:
the first CP1 side is free of the first barrier structure; and
the first barrier structure covers a majority of the second CP1 side.

19. The method of claim 17, wherein:
the first conductive pattern (CP1) comprises a CP1 trace, and a CP1 via extending vertically from the CP1 trace;
the first barrier structure laterally surrounds the CP1 trace and the CP1 via; and
the substrate comprises a dielectric material, where a single layer of the dielectric material laterally surrounds the CP1 trace and the CP1 via.

20. The method of claim 17, wherein the first barrier structure comprises:
a first barrier oxide contacting the first lateral CP1 side, the first barrier oxide comprising a first lateral side that faces laterally away from the first lateral CP1 side; and
a first seed metal that contacts the first lateral side of the first barrier oxide.

* * * * *